(12) United States Patent
Genier

(10) Patent No.: US 11,344,972 B2
(45) Date of Patent: May 31, 2022

(54) LASER PROCESSING OF WORKPIECES

(71) Applicant: CORNING INCORPORATED, Corning, NY (US)

(72) Inventor: Michael Lucien Genier, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 189 days.

(21) Appl. No.: 16/745,480

(22) Filed: Jan. 17, 2020

(65) Prior Publication Data

US 2020/0254567 A1 Aug. 13, 2020

Related U.S. Application Data

(60) Provisional application No. 62/803,789, filed on Feb. 11, 2019.

(51) Int. Cl.
*H01L 29/30* (2006.01)
*B23K 26/352* (2014.01)
*H01L 21/268* (2006.01)
*H01L 29/32* (2006.01)

(52) U.S. Cl.
CPC .......... *B23K 26/352* (2015.10); *H01L 21/268* (2013.01); *H01L 29/32* (2013.01)

(58) Field of Classification Search
CPC ... H01L 21/22; H01L 21/268; H01L 21/3221; H01L 21/486; H01L 21/78; H01L 23/15;
(Continued)

(56) References Cited

U.S. PATENT DOCUMENTS 8,841,213 B2 9/2014 Shimoi et al.
10,522,963 B2 12/2019 Comstock, II et al.
(Continued)

FOREIGN PATENT DOCUMENTS

EP 3311947 A1 * 4/2018 ......... B23K 26/0648
WO 2016079275 A1 5/2016

OTHER PUBLICATIONS

International Search Report and Written Opinion of the International Searching Authority; PCT/US2020/014242; dated May 26, 2020; 12 Pages; European Patent Office.
(Continued)

*Primary Examiner* — Brook Kebede
(74) *Attorney, Agent, or Firm* — Amy T. Lang

(57) ABSTRACT

A method for processing a transparent workpiece includes generating a beam of radiation and forming a defect in or on an object. The beam is a quasi-non-diffracting beam and has a focal volume. Forming the defect includes directing the beam onto the object and positioning the focal volume partially or fully within the object. Generating the beam includes partially blocking the beam upstream of the focal volume to adjust an axial symmetry of the freeform energy distribution with respect to an optical axis of the beam using an adjustable blocking element and/or spatially modulating a phase of the beam upstream of the focal volume to adjust a geometry of the freeform energy distribution using a phase mask. The freeform energy distribution has energy sufficient to induce multi-photon absorption in a region of the object that is co-located with the focal volume. The induced multi-photon absorption produces the defect.

16 Claims, 12 Drawing Sheets

(58) Field of Classification Search
CPC . H01L 23/49827; H01L 23/562; H01L 29/32; B23K 26/0006; B23K 26/009; B23K 26/035; B23K 26/0624; B23K 26/067; B23K 26/16; B23K 26/352; B23K 26/38; B23K 26/40; B23K 26/53; B23K 26/364; B23K 26/382; C04B 41/0036; C04B 41/4572; C04B 41/5353
USPC .................................................. 257/75, 617
See application file for complete search history.

(56) References Cited

U.S. PATENT DOCUMENTS

| | | |
|---|---|---|
| 2012/0111310 A1 | 5/2012 | Ryu et al. |
| 2015/0136743 A1 | 5/2015 | Hosseini |
| 2017/0189991 A1* | 7/2017 | Gollier ............... B23K 26/0648 |
| 2017/0252859 A1 | 9/2017 | Kumkar et al. |
| 2017/0259375 A1 | 9/2017 | Kumkar et al. |
| 2018/0093914 A1 | 4/2018 | Akarapu et al. |
| 2018/0342450 A1 | 11/2018 | Huang et al. |
| 2019/0321921 A1* | 10/2019 | Paris .................... B23K 26/364 |

OTHER PUBLICATIONS

Borghi et al; "M2 Factor of Bessel-Gauss Beams"; Optics Letters, vol. 22(5), pp. 262-264 (1997).
Siegman; "New Developments in Laser Resonators"; SPIE; vol. 1224, Optical Resonators, pp. 2-14; (1990).

* cited by examiner

LASER PROCESSING OF WORKPIECES

This application claims the benefit of priority to U.S. Provisional Application Ser. No. 62/803,789 filed on Feb. 11, 2019, the content of which is relied upon and incorporated herein by reference in its entirety.

BACKGROUND

Field

The present specification generally relates to apparatuses and methods for laser processing workpieces, and more particularly, to selective laser processing workpiece stacks comprising multiple workpieces.

Technical Background

The area of laser processing of materials encompasses a wide variety of applications that involve cutting, drilling, milling, welding, melting, etc. of different types of materials. Among these processes, one that is of particular interest is cutting or separating different types of substrates in a process that may be utilized in the production of materials such as glass, sapphire, or fused silica for thin film transistors (TFT), micro-electronics, MEMS, optics, micro-optics, bio-optics or display materials for electronic devices.

From process development and cost perspectives there are many opportunities for improvement in cutting and separating substrates. It is of great interest to have a faster, cleaner, cheaper, more repeatable, and more reliable method of separating substrates than what is currently practiced in the market. Accordingly, a need exists for alternative improved methods for separating substrates.

SUMMARY

According to a first embodiment, a method comprises generating a beam of radiation and forming a defect in or on an object. The beam is a quasi-non-diffracting beam and has a focal volume. Forming the defect includes directing the beam onto the object and positioning the focal volume partially or fully within the object. Generating the beam includes partially blocking the beam upstream of the focal volume to adjust an axial symmetry of the freeform energy distribution with respect to an optical axis of the beam using an adjustable blocking element and/or spatially modulating a phase of the beam upstream of the focal volume to adjust a geometry of the freeform energy distribution using a phase mask. The freeform energy distribution has energy sufficient to induce multi-photon absorption in a region of the object that is co-located with the focal volume. The induced multi-photon absorption produces the defect.

A second embodiment includes the method of the first embodiment, wherein the defect comprises a shape that is substantially similar to the freeform energy distribution.

A third embodiment includes the method of the first or second embodiments, wherein the adjustable blocking element comprises a liquid crystal optical element and the partially blocking comprises adjusting the liquid crystal optical element to selectively block a portion of the beam.

A fourth embodiment includes any of the previous embodiments, wherein the freeform energy distribution comprises a combination of a circular cylinder portion and an elliptic cylinder portion, each having a longitudinal axis along an optical axis of the beam.

A fifth embodiment includes the method of any of the first to third embodiments, wherein the freeform energy distribution comprises an hourglass shape having a longitudinal axis along an optical axis of the beam.

A sixth embodiment includes the method of any of the first to third embodiments, wherein defect comprises a break feature, a cavity, or both.

A seventh embodiment includes any of the previous embodiments, wherein the object comprises a transparent substrate.

An eighth embodiment includes any of the previous embodiments, wherein the transparent substrate comprises crystalline quartz, fused silica, crown glass, borosilicate glass, soda lime glass, and/or phosphate glass, fluoride crystal, silicon crystal, sapphire, glass ceramics, transparent ceramics, polymers, or plastics.

A ninth embodiment includes any of the first to seventh embodiments, wherein the transparent substrate comprises a semiconductor substrate.

A tenth embodiment includes the method of the ninth embodiment, wherein the semiconductor substrate comprises silicon, silicon carbide, germanium, gallium arsenide, indium gallium arsenide, aluminum gallium arsenide, gallium nitride, aluminum gallium nitride, indium phosphate, or lithium niobate.

An eleventh embodiment includes any of the first to seventh embodiments, wherein the transparent substrate comprises a composite wafer, wherein the composite wafer comprises a plurality of layers of different materials, and wherein the different materials comprise any of glass, ceramic, semiconductors, polymers, or plastic.

A twelfth embodiment includes any of the previous embodiments, wherein the radiation comprises a wavelength in a range approximately from 250 nm to 2.0 μm.

A thirteenth embodiment includes any of the previous embodiments, wherein a rate of defect formation is greater than approximately 1000 defects per minute.

A fourteenth embodiment includes any of the second to thirteenth embodiments, wherein the spatially modulating comprises moving an optical center of the phase mask away from the optical axis.

A fourteenth embodiment includes any of the second to fourteenth embodiments, wherein the quasi-non-diffracting beam comprises a wavelength λ, a spot size $w_o$, and a cross section that comprises a Rayleigh range $Z_R$ that is greater than $$F_D \frac{\pi w_0^2}{\lambda},$$

wherein $F_D$ is a dimensionless divergence factor having a value greater than approximately 10.

A sixteenth embodiment includes any of the second to fifteenth embodiments, wherein the freeform energy distribution comprises a first cross section and a second cross section and the second cross section is parallel to the first cross section and is geometrically dissimilar from the first cross section.

According to a seventeenth embodiment, a substrate comprises a body. The body comprises first and second surfaces and a modified region. The first surface is opposite the second surface. The modified region is positioned between the first and second surfaces. The modified region is configured to be etched. The modified region comprises a freeform shape, a cross section comprising an elliptical cross section, and broken chemical bonds induced by a quasi-non-diffracting beam.

An eighteenth embodiment includes the substrate of the seventeenth embodiment, wherein the substrate is transparent.

A nineteenth embodiment includes the substrate of the seventeenth or eighteenth embodiment, wherein the substrate further comprises crystalline quartz, fused silica, crown glass, borosilicate glass, soda lime glass, and/or phosphate glass, fluoride crystal, silicon crystal, sapphire, glass ceramics, transparent ceramics, polymers, or plastics.

A twentieth embodiment includes the substrate of the seventeenth or eighteenth embodiment, wherein the substrate further comprises semiconductor material.

A twenty-first embodiment includes the substrate of the twentieth embodiment, wherein the semiconductor material comprises silicon, silicon carbide, germanium, gallium arsenide, indium gallium arsenide, aluminum gallium arsenide, gallium nitride, aluminum gallium nitride, indium phosphate, or lithium niobate.

A twenty-second embodiment includes the substrate of the seventeenth or eighteenth embodiment, wherein the substrate further comprises further comprising a composite wafer, wherein the composite wafer comprises a plurality of layers of different materials, and wherein the different materials comprise any of glass, ceramic, semiconductors, polymers, or plastic.

A twenty-third embodiment includes any of the seventeenth to twenty-second embodiments, wherein the modified region further comprises damaged material of the substrate.

A twenty-fourth embodiment includes any of the seventeenth to twenty-third embodiments, wherein the cross section is parallel to the first surface, is defined by a boundary of the freeform shape and has a distance measured from the first surface and a size of the cross section scales or is constant as a function of the distance.

A twenty-fifth embodiment includes any of the seventeenth to twenty-fourth embodiments, wherein a middle plane is defined approximately equidistant from the first and second surfaces and the size of the cross section decreases as the distance approaches the middle plane.

A twenty-sixth embodiment includes any of the seventeenth to twenty-fourth embodiments, wherein a middle plane is defined approximately equidistant from the first and second surfaces and the size of the cross section increases as the distance approaches the middle plane.

A twenty-seventh embodiment includes any of the seventeenth to twenty-fourth embodiments, wherein the size of the cross section increases continuously as the distance, beginning from the first surface, approaches the second surface.

A twenty-eighth embodiment includes any of the seventeenth to twenty-seventh embodiments, wherein the modified region does not intersect the first or second surfaces.

A twenty-ninth embodiment includes any of the seventeenth to twenty-eighth embodiments, wherein the substrate further comprises another modified region, wherein the another modified region comprises another freeform shape and is positioned between the first and second surfaces, another cross section is parallel to the first surface and is defined by a boundary of the another freeform shape, the another cross section comprises another elliptical cross section, and the modified region and the another modified region are aligned approximately along a contour line that is straight and/or curved.

A thirtieth embodiment includes the substrate of the twenty-ninth embodiment, wherein major axes of the elliptical cross section and the another elliptical cross section are aligned approximately along the contour line.

A thirty-first embodiment includes the substrate of the twenty-ninth or thirtieth embodiment, wherein the substrate further comprises product articles to be separated, the product articles being defined by a plurality of contours that comprises the contour.

A thirty-second embodiment includes the substrate of the thirty-first embodiment, wherein the plurality of contours form latent separation features such that the substrate is configured to undergo a fabrication process as a single article before being separated into the product articles.

A thirty-third embodiment includes any of the seventeenth to twenty-third embodiments, the modified region further comprises first and second cross sections that are parallel to the first surface and are defined by a boundary of the freeform shape, wherein the first cross section is geometrically dissimilar from the second cross section.

A thirty-fourth embodiment includes the substrate of the thirty-third embodiment, wherein the freeform shape comprises an elliptic cylinder portion and a circular cylinder portion, the elliptic cylinder portion is connected to the circular cylinder portion and is proximate to the first surface, and the substrate further comprises an opening formed at an intersection between the elliptic cylinder portion and the first surface.

A thirty-fifth embodiment includes the substrate of the thirty-third embodiment, wherein the freeform shape comprises an elliptic cylinder portion and a circular cylinder portion, the circular cylinder portion is connected to the elliptic cylinder portion and is proximate to the first surface, and the substrate further comprises an opening formed at an intersection between the circular cylinder portion and the first surface.

A thirty-sixth embodiment includes any of the thirty-third to thirty-fifth embodiments, wherein the modified region comprises fractured particles that are configured to enhance capillary action.

A thirty-seventh embodiment includes any of the thirty-third to thirty-fifth embodiments, wherein the second surface comprises a coating.

A thirty-eighth embodiment includes the substrate of the thirty-seventh embodiment, wherein the coating comprises an optical filter configured to filter radiation based on wavelength.

A thirty-ninth embodiment includes the substrate of the thirty-eighth embodiment, wherein the optical filter comprises a multivariate optical element configured to filter radiation based on a continuous spectrum.

A fortieth embodiment includes the substrate of the thirty-seventh embodiment, wherein the coating comprises an antireflective coating.

A forty-first embodiment includes any of the thirty-seventh to fortieth embodiments, wherein the coating is configured to protect the substrate.

A forty-second embodiment includes any of the seventeenth to twenty-third embodiments, wherein the modified region extends to the first and second surfaces and is configured to provide a throughput between the first and second surfaces, and further comprises openings formed at intersections between the modified region and the first and second surfaces.

A forty-third embodiment includes any of the seventeenth to twenty-third embodiments, wherein the freeform shape comprises an oblique elliptic cylindrical shape that extends to the first and second surfaces, the oblique elliptic cylindrical shape comprises a canted central axis that defines an angle different than a right angle relative to the first surface, and the substrate further comprises openings formed at intersections between the oblique elliptical cylinders and the first and second surfaces.

According to a forty-fourth embodiment, a substrate comprises a body. The body comprises first and second surfaces and a modified region. The first surface is opposite the second surface. The modified region is positioned between the first and second surfaces. The modified region comprises an etched cavity having a surface comprising broken chemical bonds induced by a quasi-non-diffracting beam, a cross section comprising an elliptical cross section, and a freeform shape.

A forty-fifth embodiment includes the substrate of the forty-fourth embodiment, wherein the substrate is transparent.

A forty-sixth embodiment includes the substrate of the forty-fourth or the forty-fifth embodiments, wherein the substrate further comprises crystalline quartz, fused silica, crown glass, borosilicate glass, soda lime glass, and/or phosphate glass, fluoride crystal, silicon crystal, sapphire, glass ceramics, transparent ceramics, polymers, or plastics.

A forty-seventh embodiment includes the substrate of the forty-fourth or the forty-fifth embodiments, wherein the substrate further comprises semiconductor material.

A forty-eighth embodiment includes the substrate of the forty-seventh embodiment, wherein the semiconductor material comprises silicon, silicon carbide, germanium, gallium arsenide, indium gallium arsenide, aluminum gallium arsenide, gallium nitride, aluminum gallium nitride, indium phosphate, or lithium niobate.

A forty-ninth embodiment includes the substrate of the forty-fourth or the forty-fifth embodiments, wherein the substrate further comprises a composite wafer, wherein the composite wafer comprises a plurality of layers of different materials, and wherein the different materials comprise any of glass, ceramic, semiconductors, polymers, or plastic.

A fiftieth embodiment includes any of the forty-fourth to forty-ninth embodiments, wherein the modified region further comprises damaged material of the substrate.

A fifty-first embodiment includes any of the forty-fourth to fiftieth embodiments, wherein the modified region further comprises first and second cross sections that are parallel to the first surface and are defined by a boundary of the freeform shape, wherein the first cross section is geometrically dissimilar from the second cross section.

A fifty-second embodiment includes the substrate of the fifty-first embodiment, wherein the cross section is parallel to the first surface, is defined by a boundary of the freeform shape and has a distance measured from the first surface, a middle plane is defined approximately equidistant from the first and second surfaces, and a size of the cross section decreases as the distance approaches the middle plane.

A fifty-third embodiment includes the substrate of the fifty-first embodiment, wherein the cross section is parallel to the first surface, is defined by a boundary of the freeform shape and has a distance measured from the first surface, a middle plane is defined approximately equidistant from the first and second surfaces, and a size of the cross section increases as the distance approaches the middle plane.

A fifty-fourth embodiment includes any of the fifty-first to fifty-third embodiments, wherein the damaged material comprises fractured particles that are configured to enhance capillary action.

A fifty-fifth embodiment includes any of the fifty-first to fifty-third embodiments, wherein the second surface comprises a coating.

A fifty-sixth embodiment includes the substrate of the fifty-fifth embodiment, wherein the coating comprises an optical filter configured to filter radiation based on wavelength.

A fifty-seventh embodiment includes the substrate of the fifty-sixth embodiment, wherein the optical filter comprises a multivariate optical element configured to filter radiation based on a continuous spectrum.

A fifty-eighth embodiment includes the substrate of the fifty-fifth embodiment, wherein the coating comprises an antireflective coating.

A fifty-ninth embodiment includes any of the fifty-fifth to fifty-eighth embodiments, wherein the coating is configured to protect the substrate.

A sixtieth embodiment includes any of the forty-fourth to fiftieth embodiments, wherein the modified region extends to the first and second surfaces, is configured to provide a throughput between the first and second surfaces, and further comprises openings formed at intersections between the modified region and the first and second surfaces.

A sixty-first embodiment includes any of the forty-fourth to fiftieth embodiments, wherein the freeform shape comprises an oblique elliptic cylindrical shape that extends to the first and second surfaces, the oblique elliptic cylindrical shape comprises a canted central axis that defines an angle different than a right angle relative to the first surface, and the substrate further comprises openings formed at intersections between the oblique elliptical cylinders and the first and second surfaces.

A sixty-second embodiment includes the substrate of the sixtieth embodiment, wherein the substrate further comprises first and second sets of electrical conducting elements on the first and second surfaces respectively, the modified region further comprises electrically conductive material, and the modified region and the first and second sets of electrical conducting elements are configured to allow signals to flow between the first and second surfaces and elements thereof.

Additional features and advantages of the processes and systems described herein will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

Figure 1A:
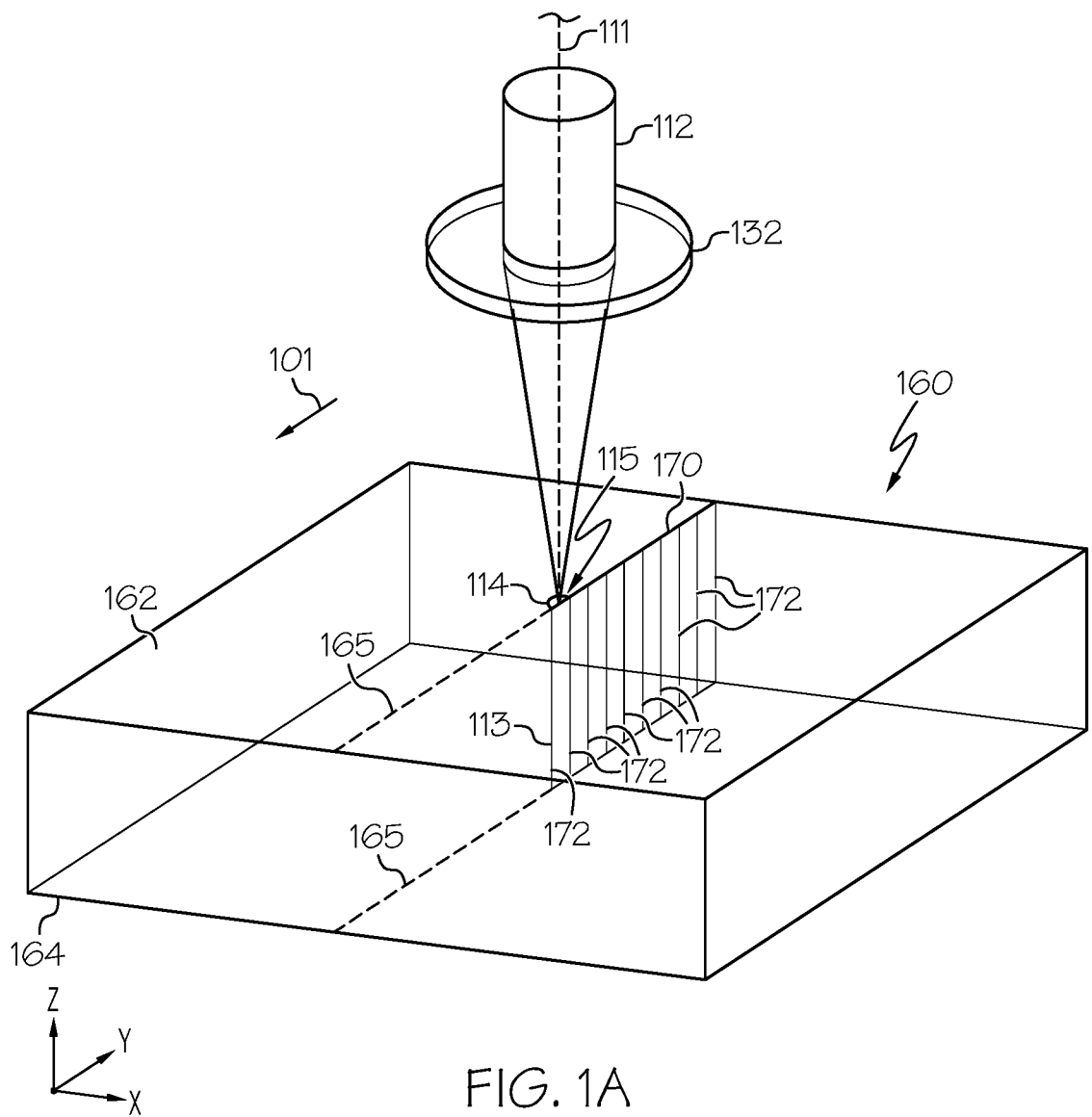
FIG. 1A shows the formation of a contour of defects in a transparent workpiece, according to one or more embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

Reference will now be made in detail to embodiments of processes for forming and laser processing workpieces and workpiece stacks comprising a plurality of workpieces, examples of which are illustrated in the accompanying drawings. Whenever possible, the same reference numerals will be used throughout the drawings to refer to the same or like parts. Laser processing the workpiece stack may comprise directing (e.g., focusing) a laser beam (e.g., a pulsed laser beam) into at least one transparent workpiece of the workpiece stack to alter the transparent workpiece, for example, separate the transparent workpiece, form a grating in the transparent workpiece, or the like. In some embodiments, it may be advantageous to direct the laser beam to form a laser beam focal line in at least one portion of the workpiece stack and not in at least one other portion of the workpiece stack, where these different portions are located in different depth positions of the workpiece stack. As one example, it may be advantageous to direct the laser beam into a laser beam focal line in a first transparent workpiece and not into a laser beam focal line in a second transparent workpiece. As another example, it may be advantageous to direct the laser beam to form a laser beam focal line in one portion of the first transparent workpiece and not in another portion of the first transparent workpiece, where these different portions are located in different depth positions of the first transparent workpiece. Furthermore, current methods to form custom-shaped defects are limited by laser system capabilities.

Embodiments are described herein to allow or enhancing laser processing of workpieces and workpiece stacks by modifying the shape of the focal line of a laser system. For example, the laser system may include a phase mask and/or adjustable blocking element to modify a shape of the focal line of the laser. The modified shape is referred to as a freeform energy distribution. The freeform energy distribution is sent into a workpiece and a defect is formed in the workpiece. The formed defect has a shape substantially similar to the shape of the freeform energy distribution. Furthermore, the methods described herein allow fabrication of substrates having defects with shapes that are not producible by known methods. Various embodiments laser processing of a workpiece and/or a workpiece stack will be described herein with specific references to the appended drawings.

As used herein, "laser processing" can comprise directing a laser beam onto and/or into a workpiece. In some embodiments, laser processing further comprises translating the laser beam relative to the workpiece, for example, along a contour line, along a modification line, or along another pathway. Examples of laser processing include using a laser beam to form a contour comprising a series of defects that extend into the workpiece, using a laser beam to form a modification track in the workpiece, and using an infrared laser beam to heat the workpieces of the workpiece stack. Laser processing may separate the workpiece along one or more desired lines of separation. However, in some embodiments, additional, non-laser steps may be utilized to separate the workpieces along one or more desired lines of separation, e.g., mechanically.

As used herein, "contour line," can denote a linear, angled, polygonal or curved line on a surface of a workpiece that defines the path traversed by the laser beam as it is moved within the plane of the workpiece to create a corresponding contour.

As used herein, "contour," can refer to a set of defects in a workpiece formed by translating a laser along a contour line. As used herein, a contour can refer to a virtual two dimensional shape or path in or on a substrate. Thus, while a contour itself is a virtual shape, the contour may be manifest, for example, by a fault line or a crack. A contour can define a surface of desired separation in the workpiece. A contour may be formed by creating a plurality of defects in the workpiece using various techniques along the contour line, for example by directing a pulsed laser beam at successive points along the contour line. Multiple contours and/or lasers with curved focal lines may be used to create complex shapes, such as a beveled surface of separation.

As used herein, a "fault line" can refer to a series of closely spaced defect lines extending along and approximating a contour.

As used herein, a "defect" can refer to a region of modified material (e.g., a region of modified refractive index relative to the bulk material), void space, crack, scratch, flaw, hole, perforation or other deformities in the workpiece. These defects may be referred to, in various embodiments herein, as defect lines or damage tracks. A defect line or damage track may be formed by a laser beam directed onto a single position of the workpiece, for a single laser pulse or multiple pulses at the same location. Translating the laser along the contour line may result in multiple defect lines that form a contour. Similarly, the term "modified region" may can refer to a defect.

As used herein, the phrase "beam cross section" can refer to the cross section of a laser beam along a plane perpendicular to a beam propagation direction of the laser beam, for example, along an X-Y plane when the beam propagation direction is in a Z direction.

As used herein, "beam spot" can refer to a cross section of a laser beam (e.g., a beam cross section) in the impingement surface, i.e., the surface of a workpiece in closest proximity to the laser optics.

As used herein, "impingement surface" can refer to the surface of a workpiece in closest proximity to the laser optics.

As used herein, "upstream" and "downstream" can refer to the relative position of two locations or components along a beam pathway with respect to a beam source. For example, a first component is upstream from a second component if the first component is closer to the laser optics along the path traversed by the laser beam than the second component.

As used herein, "laser beam focal line," or "focal line," can refer to pattern of interacting (e.g., crossing) light rays of a laser beam that form a linear, elongated focused region, parallel to an optical axis. The laser beam focal line comprises aberrated light rays that interact (e.g., cross) at different positions along the optical axis. A laser beam focal line may, for example, create a defect having a linear shape. Furthermore, the laser beam focal lines described herein are formed using a quasi-non-diffracting beam, mathematically defined in detail below.

The terms "object," "workpiece," "substrate," and the like, as used herein, can refer to objects that are the target of laser processing and the terms may be used interchangeably. The phrase "workpiece," as used herein, can mean a workpiece formed from glass, glass-ceramic or other material which is transparent, where the term "transparent," as used herein, may mean that the material has an optical absorption of less than 20% per mm of material depth, such as less than 10% per mm of material depth for the specified pulsed laser wavelength, or such as less than 1% per mm of material depth for the specified pulsed laser wavelength. The material may have an optical absorption of less than about 20% per mm of material depth. The transparent workpiece may have a depth (e.g., thickness) of from about 50 microns (μm) to about 10 mm (such as from about 100 μm to about 5 mm, or from about 0.5 mm to about 3 mm. Transparent workpieces may comprise glass workpieces formed from glass compositions, such as borosilicate glass, soda-lime glass, aluminosilicate glass, alkali aluminosilicate, alkaline earth aluminosilicate glass, alkaline earth boro-aluminosilicate glass, fused silica, or crystalline materials such as quartz, sapphire or combinations thereof. Transparent workpieces may comprise semiconductor material, such as silicon, silicon carbide, germanium, gallium arsenide, indium gallium arsenide, aluminum gallium arsenide, gallium nitride, aluminum gallium nitride, indium phosphate, or lithium niobate. Transparent workpieces may comprise a composite wafer, where the composite wafer comprises a plurality of layers of different materials, and where the different materials comprise any of glass, ceramic, semiconductors, polymers, or plastics. In some embodiments the transparent workpiece may be strengthened via thermal tempering before or after laser processing the transparent workpiece. In some embodiments, the glass may be ion-exchangeable, such that the glass composition can undergo ion-exchange for glass strengthening before or after laser processing the transparent workpiece. For example, the transparent workpiece may comprise ion exchanged and ion exchangeable glass, such as Corning Gorilla® Glass available from Corning Incorporated of Corning, N.Y. (e.g., code 2318, code 2319, and code 2320). Further, these ion exchanged glasses may have coefficients of thermal expansion (CTE) of from about 6 ppm/° C. to about 10 ppm/° C. Other example transparent workpieces may comprise EAGLE XG® and CORNING LOTUS™ available from Corning Incorporated of Corning, N.Y. Moreover, the transparent workpiece may comprise other components which are transparent to the wavelength of the laser, for example, crystals such as sapphire or zinc selenide.

In an ion exchange process, ions in a surface layer of the transparent workpiece are replaced by larger ions having the same valence or oxidation state, for example, by partially or fully submerging the transparent workpiece in an ion exchange bath. Replacing smaller ions with larger ions causes a layer of compressive stress to extend from one or more surfaces of the transparent workpiece to a certain depth within the transparent workpiece, referred to as the depth of layer. The compressive stresses are balanced by a layer of tensile stresses (referred to as central tension), such that the net stress in the glass sheet is zero. The formation of compressive stresses at the surface of the glass sheet makes the glass strong and resistant to mechanical damage and, as such, mitigates catastrophic failure of the glass sheet for flaws which do not extend through the depth of layer. In some embodiments, smaller sodium ions in the surface layer of the transparent workpiece are exchanged with larger potassium ions. In some embodiments, the ions in the surface layer and the larger ions are monovalent alkali metal cations, such as Li+ (when present in the glass), Na+, K+, Rb+, and Cs+. Alternatively, monovalent cations in the surface layer may be replaced with monovalent cations other than alkali metal cations, such as Ag+, Tl+, Cu+, or the like.

Laser Processing Systems

Figure 1B:
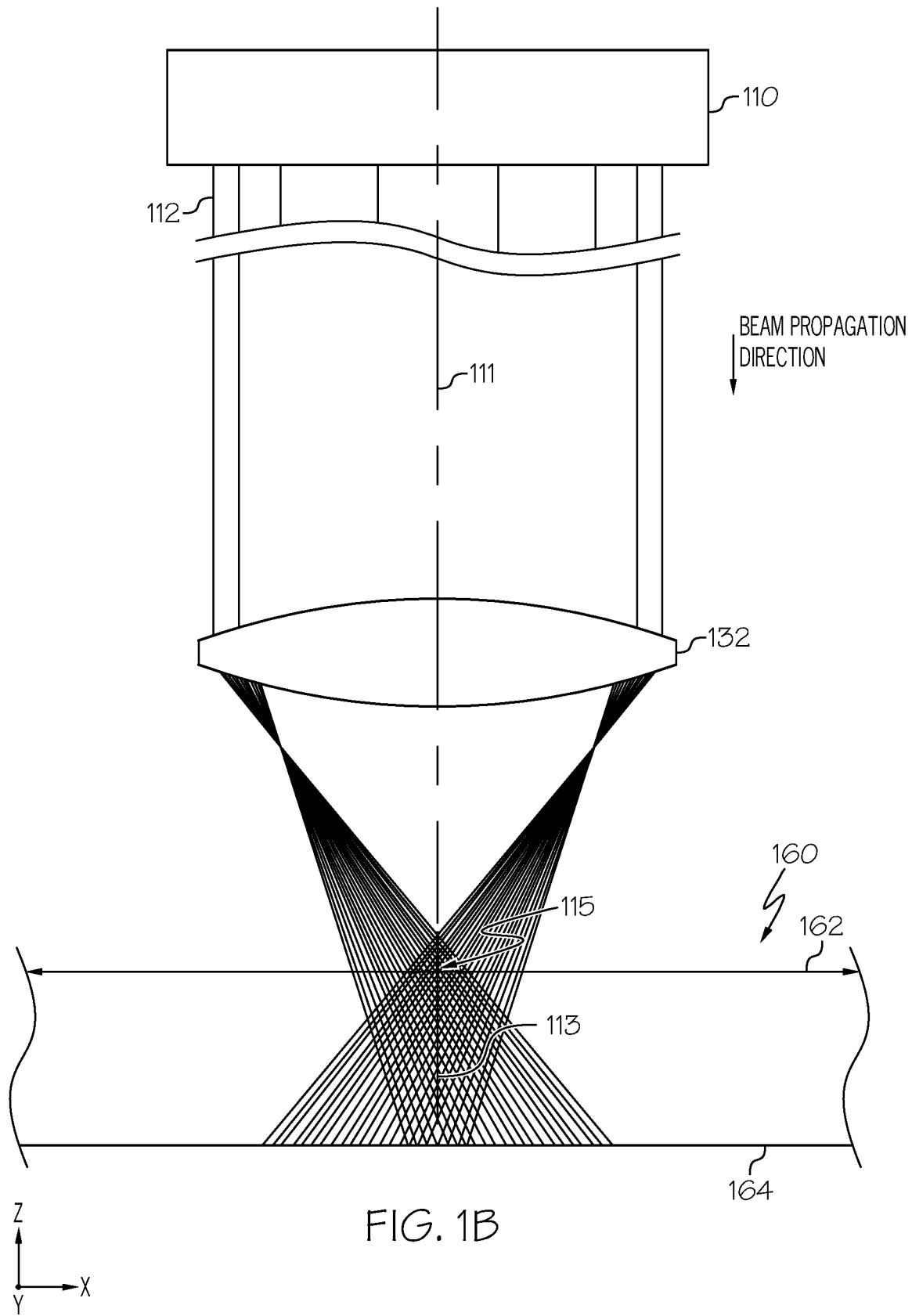
FIG. 1B shows the positioning of a laser beam focal line during processing of a transparent workpiece, according to one or more embodiments.

Referring now to FIGS. 1A and 1B, the figures show an exemplary transparent workpiece 160 undergoing laser processing, according to one or more embodiments. In particular, FIG. 1A shows the formation of a contour 170 comprising a plurality of defects 172, which may be used to separate the transparent workpiece 160. The contour 170 comprising the plurality of defects 172 may be formed by processing the transparent workpiece 160 with a laser beam 112, which may comprise an ultra-short pulsed laser beam moving in a translation direction 101 along a contour line 165. The defects 172 may extend, for example, through the depth of the transparent workpiece 160, and may be orthogonal to an impingement surface of the transparent workpiece 160. Further, the laser beam 112 initially contacts the transparent workpiece 160 at an impingement location 115, which is a specific location on the impingement surface. As depicted in FIGS. 1A and 1B, a first surface 162 of the transparent workpiece 160 comprises the impingement surface, however, it should be understood that in other embodiments, the laser beam 112 may instead initially irradiate a second surface 164 of the transparent workpiece 160. Furthermore, FIG. 1A depicts that the laser beam 112 forms a beam spot 114 projected onto the first surface 162 of the transparent workpiece 160.

FIGS. 1A and 1B depict the laser beam 112 propagating along a beam pathway 111 and oriented such that the laser beam 112 may be focused into a laser beam focal line 113 within the transparent workpiece 160, for example, using an aspheric optical element 120 (FIG. 2), for example, an axicon and one or more lenses (e.g., a first lens 130 and a second lens 132, as described below and depicted in FIG. 2). For example, the position of the laser beam focal line 113 may be controlled along the Z-axis and about the Z-axis.

Further, the laser beam focal line 113 may have a length in a range of from about 0.1 mm to about 100 mm or in a range of from about 0.1 mm to about 10 mm. Various embodiments may be configured to have a laser beam focal line 113 with a length 1 of about 0.1 mm, about 0.2 mm, about 0.3 mm, about 0.4 mm, about 0.5 mm, about 0.7 mm, about 1 mm, about 2 mm, about 3 mm, about 4 mm, or about 5 mm e.g., from about 0.5 mm to about 5 mm. Further, the laser beam focal line 113 may be a portion of a quasi-non-diffracting beam, as defined in more detail below.

In operation, the laser beam 112 may be translated relative to the transparent workpiece 160 (e.g., in the translation direction 101) along the contour line 165 to form the plurality of defects 172 of the contour 170. Directing or localizing the laser beam 112 into the transparent workpiece 160 generates an induced absorption within the transparent workpiece 160 and deposits enough energy to break chemical bonds in the transparent workpiece 160 at spaced locations along the contour line 165 to form the defects 172. According to one or more embodiments, the laser beam 112 may be translated across the transparent workpiece 160 by motion of the transparent workpiece 160 (e.g., motion of a translation stage 190 coupled to the transparent workpiece 160, as shown in FIG. 2), motion of the laser beam 112 (e.g., motion of the laser beam focal line 113), or motion of both the transparent workpiece 160 and the laser beam focal line 113. By translating the laser beam focal line 113 relative to the transparent workpiece 160, the plurality of defects 172 may be formed in the transparent workpiece 160.

In some embodiments, the defects 172 may generally be spaced apart from one another by a distance along the contour 170 of from about 0.1 μm to about 500 μm, for example, about 1 μm to about 200 μm, about 2 μm to about 100 μm, about 5 μm to about 20 μm, or the like. For example, suitable spacing between the defects 172 may be from about 0.1 μm to about 50 μm, such as from about 5 μm to about 15 μm, from about 5 μm to about 12 μm, from about 7 μm to about 15 μm, or from about 7 μm to about 12 μm for the TFT/display glass compositions. In some embodiments, a spacing between adjacent defects 172 may be about 50 μm or less, 45 μm or less, 40 μm or less, 35 μm or less, 30 μm or less, 25 μm or less, 20 μm or less, 15 μm or less, 10 μm or less, or the like.

As illustrated in FIG. 1A, the plurality of defects 172 of the contour 170 extend into the transparent workpiece 160 and establish a path for crack propagation for separation of the transparent workpiece 160 into separate portions along the contour 170. Forming the contour 170 comprises translating the laser beam 112 relative to the transparent workpiece 160 (e.g., in the translation direction 101) along the contour line 165 to form the plurality of defects 172 of the contour 170. According to one or more embodiments, the laser beam 112 may be translated across the transparent workpiece 160 by motion of the transparent workpiece 160, motion of the laser beam 112 (e.g., motion of the laser beam focal line 113), or motion of both the transparent workpiece 160 and the laser beam 112, for example, using one or more translation stages (e.g., translation stage 190 in FIG. 2). By translating the laser beam focal line 113 relative to the transparent workpiece 160, the plurality of defects 172 may be formed in the transparent workpiece 160. Moreover, while the contour 170 illustrated in FIG. 1A is linear, the contour 170 may also be nonlinear (i.e., having a curvature). Curved contours may be produced, for example, by translating either the transparent workpiece 160 or laser beam focal line 113 with respect to the other in two dimensions instead of one dimension.

In some embodiments, the transparent workpiece 160 may be further acted upon in a subsequent separating step to induce separation of the transparent workpiece 160 along the contour 170. The subsequent separating step may include using mechanical force or thermal stress induced force to propagate a crack along the contour 170. The thermal source, such as an infrared laser beam, may be used to create thermal stress and thereby separate the transparent workpiece 160 along the contour 170. In some embodiments, the infrared laser beam may be used to initiate separation and then the separation may be finished mechanically. Without being bound by theory, the infrared laser is a controlled heat source that rapidly increases the temperature of the transparent workpiece 160 at or near the contour 170. This rapid heating may build compressive stress in the transparent workpiece 160 on or adjacent to the contour 170. Since the area of the heated glass surface is relatively small compared to the overall surface area of the transparent workpiece 160, the heated area cools relatively rapidly. The resultant temperature gradient induces tensile stress in the transparent workpiece 160 sufficient to propagate a crack along the contour 170 and through the depth of the transparent workpiece 160, resulting in full separation of the transparent workpiece 160 along the contour 170. Without being bound by theory, it is believed that the tensile stress may be caused by expansion of the glass (i.e., changed density) in portions of the workpiece with higher local temperature.

Suitable infrared lasers to create thermal stress in glass would typically have wavelengths that are readily absorbed by glass, typically having wavelengths ranging from 1.2 μm to 13 μm, for example, a range of 4 μm to 12 μm. Further, the power of the infrared laser beam may be from about 10 W to about 1000 W, for example 100 W, 250 W, 500 W, 750 W, or the like. Moreover, the $1/e^2$ beam diameter of the infrared laser beam may be about 20 mm or less, for example, 15 mm, 12 mm, 10 mm, 8 mm, 5 mm, 2 mm, or less. In operation, a larger $1/e^2$ beam diameter of the infrared laser beam may facilitate faster laser processing and more power while a smaller $1/e^2$ beam diameter of the infrared laser beam may facilitate high precision separation by limiting damage to portions of the transparent workpiece 160 near the contour 170. Example infrared lasers include a carbon dioxide laser (a "$CO_2$ laser"), a carbon monoxide laser (a "CO laser"), a solid state laser, a laser diode, or combinations thereof.

In other embodiments, stress present in the transparent workpiece 160, depending on the type, depth, and material properties (e.g., absorption, CTE, stress, composition, etc.) may cause spontaneous separation along the contour 170 without further heating or mechanical separation steps. For example, when the transparent workpiece 160 comprises a strengthened glass substrate (e.g., an ion-exchanged or thermally tempered glass substrate), the formation of the contour 170 may induce crack propagation along the contour 170 to separate the transparent workpiece 160.

Referring again to FIGS. 1A and 1B, the laser beam 112 used to form the defects 172 further has an intensity distribution I(X,Y,Z), where Z is the beam propagation direction of the laser beam 112, and X and Y are directions orthogonal to the direction of propagation, as depicted in the figures. The X-direction and Y-direction may also be referred to as cross-sectional directions and the X-Y plane may be referred to as a cross-sectional plane. The intensity distribution of the laser beam 112 in a cross-sectional plane may be referred to as a cross-sectional intensity distribution.

The laser beam 112 at the beam spot 114 or other cross sections may comprise a quasi-non-diffracting beam, for example, a beam having low beam divergence as mathematically defined below, by propagating the laser beam 112 (e.g., the laser beam 112, such as a Gaussian beam, using a beam source 110, such as a pulsed beam source) through an aspheric optical element 120, as described in more detail below with respect to the optical assembly 100 depicted in FIG. 2. Beam divergence can refer to the rate of enlargement of the beam cross section in the direction of beam propagation (i.e., the Z direction). One example beam cross section discussed herein is the beam spot 114 of the laser beam 112 projected onto the transparent workpiece 160. Example quasi-non-diffracting beams include Gauss-Bessel beams and Bessel beams.

Diffraction is one factor that leads to divergence of laser beams 112. Other factors include focusing or defocusing caused by the optical systems forming the laser beams 112 or refraction and scattering at interfaces. Laser beams 112 for forming the defects 172 of the contour 170 may form laser beam focal lines 113 with low divergence and weak diffraction. The divergence of the laser beam 112 is characterized by the Rayleigh range $Z_R$, which is related to the variance $\sigma^2$ of the intensity distribution and beam propagation factor $M^2$ of the laser beam 112. In the discussion that follows, formulas will be presented using a Cartesian coordinate system. Corresponding expressions for other coordinate systems are obtainable using mathematical techniques known to those of skill in the art. Additional information on beam divergence can be found in the articles entitled "New Developments in Laser Resonators" by A. E. Siegman in SPIE Symposium Series Vol. 1224, p. 2 (1990) and "$M^2$ factor of Bessel-Gauss beams" by R. Borghi and M. Santarsiero in Optics Letters, Vol. 22(5), 262 (1997), the disclosures of which are incorporated herein by reference in their entirety. Additional information can also be found in the international standards ISO 11146-1:2005(E) entitled "Lasers and laser-related equipment—Test methods for laser beam widths, divergence angles and beam propagation ratios—Part 1: Stigmatic and simple astigmatic beams", ISO 11146-2:2005(E) entitled "Lasers and laser-related equipment—Test methods for laser beam widths, divergence angles and beam propagation ratios—Part 2: General astigmatic beams", and ISO 11146-3:2004(E) entitled "Lasers and laser-related equipment—Test methods for laser beam widths, divergence angles and beam propagation ratios—Part 3: Intrinsic and geometrical laser beam classification, propagation and details of test methods", the disclosures of which are incorporated herein by reference in their entirety.

The spatial coordinates of the centroid of the intensity profile of the laser beam 112 having a time-averaged intensity profile $I(x, y, z)$ are given by the following expressions:

$$\overline{x}(z) = \frac{\int_{-\infty}^{\infty}\int_{-\infty}^{\infty} x I(x, y, z) dx dy}{\int_{-\infty}^{\infty}\int_{-\infty}^{\infty} I(x, y, z) dx dy} \quad (1)$$

$$\overline{y}(z) = \frac{\int_{-\infty}^{\infty}\int_{-\infty}^{\infty} y I(x, y, z) dx dy}{\int_{-\infty}^{\infty}\int_{-\infty}^{\infty} I(x, y, z) dx dy} \quad (2)$$

These are also known as the first moments of the Wigner distribution and are described in Section 3.5 of ISO 11146-2:2005(E). Their measurement is described in Section 7 of ISO 11146-2:2005(E).

Variance is a measure of the width, in the cross-sectional (X-Y) plane, of the intensity distribution of the laser beam 112 as a function of position z in the direction of beam propagation. For an arbitrary laser beam, variance in the X-direction may differ from variance in the Y-direction. We let $\sigma_x^2(z)$ and $\sigma_y^2(z)$ represent the variances in the X-direction and Y-direction, respectively. Of particular interest are the variances in the near field and far field limits. We let $\sigma_{0x}^2(z)$ and $\sigma_{0y}^2(z)$ represent variances in the X-direction and Y-direction, respectively, in the near field limit, and we let $\sigma_{\infty x 0}^2(z)$ and $\sigma_{\infty y}^2(z)$ represent variances in the X-direction and Y-direction, respectively, in the far field limit. For a laser beam having a time-averaged intensity profile $I(x, y, z)$ with Fourier transform $\tilde{I}(v_x, v_y)$ (where $v_x$ and $v_y$ are spatial frequencies in the X-direction and Y-direction, respectively), the near field and far field variances in the X-direction and Y-direction are given by the following expressions:

$$\sigma_{0x}^2(z) = \frac{\int_{-\infty}^{\infty}\int_{-\infty}^{\infty} x^2 I(x, y, z) dx dy}{\int_{-\infty}^{\infty}\int_{-\infty}^{\infty} I(x, y, z) dx dy} \quad (3)$$

$$\sigma_{0y}^2(z) = \frac{\int_{-\infty}^{\infty}\int_{-\infty}^{\infty} y^2 I(x, y, z) dx dy}{\int_{-\infty}^{\infty}\int_{-\infty}^{\infty} I(x, y, z) dx dy} \quad (4)$$

$$\sigma_{\infty x}^2 = \frac{\int_{-\infty}^{\infty}\int_{-\infty}^{\infty} v_x^2 \tilde{I}(v_x, v_y) dv_x dv_y}{\int_{-\infty}^{\infty}\int_{-\infty}^{\infty} \tilde{I}(v_x, v_y) dv_x dv_y} \quad (5)$$

$$\sigma_{\infty y}^2 = \frac{\int_{-\infty}^{\infty}\int_{-\infty}^{\infty} v_y^2 \tilde{I}(v_x, v_y) dv_x dv_y}{\int_{-\infty}^{\infty}\int_{-\infty}^{\infty} \tilde{I}(v_x, v_y) dv_x dv_y} \quad (6)$$

The variance quantities $\sigma_{0x}^2(z)$, $\sigma_{0y}^2(z)$, $\sigma_{\infty x}^2$, and $\sigma_{\infty y}^2$ are also known as the diagonal elements of the Wigner distribution (see ISO 11146-2:2005(E)). These variances can be quantified for an experimental laser beam using the measurement techniques described in Section 7 of ISO 11146-2:2005(E). In brief, the measurement uses a linear unsaturated pixelated detector to measure $I(x, y)$ over a finite spatial region that approximates the infinite integration area of the integral equations which define the variances and the centroid coordinates. The appropriate extent of the measurement area, background subtraction and the detector pixel resolution are determined by the convergence of an iterative measurement procedure described in Section 7 of ISO 11146-2:2005(E). The numerical values of the expressions given by equations 1-6 are calculated numerically from the array of intensity values as measured by the pixelated detector.

Through the Fourier transform relationship between the transverse amplitude profile $\tilde{u}(x, y, z)$ for an arbitrary optical beam (where $I(x, y, z) \equiv |\tilde{u}(x, y, z)|^2$) and the spatial-frequency distribution $\tilde{P}(v_x, v_y, z)$ for an arbitrary optical beam (where $\tilde{I}(v_x, v_y) \equiv |\tilde{P}(v_x, v_y, z)|^2$), it can be shown that:

$$\sigma_x^2(z) = \sigma_{0x}^2(z_{0x}) + \lambda^2 \sigma_{\infty x}^2(z - z_{0x})^2 \quad (7)$$

$$\sigma_y^2(z) = \sigma_{0y}^2(z_{0y}) + \lambda^2 \sigma_{\infty y}^2(z - z_{0y})^2 \quad (8)$$

In equations (7) and (8), $\sigma_{0x}^2(z_{0x})$ and $\sigma_{0y}^2(z_{0y})$ are minimum values of $\sigma_{0x}^2(z)$ and $\sigma_{0y}^2(z)$, which occur at waist positions $z_{0x}$ and $z_{0y}$ in the x-direction and y-direction, respectively, and $\lambda$ is the wavelength of the laser beam 112. Equations (7) and (8) indicate that $\sigma_x^2(z)$ and $\sigma_y^2(z)$ increase quadratically with z in either direction from the minimum values associated with the waist position of the laser beam 112 (e.g., the waist portion of the laser beam focal line 113). Further, in the embodiments described herein comprising a beam spot 114 that is axisymmetric and thereby comprises an axisymmetric intensity distribution I(x,y), $\sigma_x^2(z)=\sigma_y^2(z)$ and in the embodiments described herein comprising a beam spot 114 that is non-axisymmetric and thereby comprises a non-axisymmetric intensity distribution I(x,y), $\sigma_x^2(z)\neq\sigma_y^2(z)$, i.e., $\sigma_x^2(z)<\sigma_y^2(z)$ or $\sigma_x^2(z)>\sigma_y^2(z)$.

Equations (7) and (8) can be rewritten in terms of a beam propagation factor $M^2$, where separate beam propagations factors $M_x^2$ and $M_y^2$ for the x-direction and the y-direction are defined as:

$$M_x^2 = 4\pi\sigma_{0x}\sigma_{\infty x} \tag{9}$$

$$M_y^2 = 4\pi\sigma_{0y}\sigma_{\infty y} \tag{10}$$

Rearrangement of Equations (9) and (10) and substitution into Equations (7) and (8) yields:

$$\sigma_x^2(z) = \sigma_{0x}^2(z_{0x}) + \frac{\lambda^2 M_x^4}{(4\pi\sigma_{0x})^2}(z - z_{0x})^2 \tag{11}$$

$$\sigma_y^2(z) = \sigma_{0y}^2(z_{0y}) + \frac{\lambda^2 M_y^4}{(4\pi\sigma_{0y})^2}(z - z_{0y})^2 \tag{12}$$

which can be rewritten as:

$$\sigma_x^2(z) = \sigma_{0x}^2(z_{0x})\left[1 + \frac{(z-z_{0x})^2}{Z_{Rx}^2}\right] \tag{13}$$

$$\sigma_y^2(z) = \sigma_{0y}^2(z_{0y})\left[1 + \frac{(z-z_{0y})^2}{Z_{Ry}^2}\right] \tag{14}$$

where the Rayleigh ranges $Z_{Rx}$ and $Z_{Ry}$ in the x-direction and y-direction, respectively, are given by:

$$Z_{Rx} = \frac{4\pi\sigma_{0x}^2}{M_x^2\lambda} \tag{15}$$

$$Z_{Ry} = \frac{4\pi\sigma_{0y}^2}{M_y^2\lambda} \tag{16}$$

The Rayleigh range corresponds to the distance (relative to the position of the beam waist as defined in Section 3.12 of ISO 11146-1:2005(E)) over which the variance of the laser beam doubles (relative to the variance at the position of the beam waist) and is a measure of the divergence of the cross sectional area of the laser beam. Further, in the embodiments described herein comprising a beam spot 114 that is axisymmetric and thereby comprises an axisymmetric intensity distribution I(x,y), $Z_{Rx}=Z_{Ry}$ and in the embodiments described herein comprising a beam spot 114 that is non-axisymmetric and thereby comprises a non-axisymmetric intensity distribution I(x,y), $Z_{Rx}\neq Z_{Ry}$, i.e., $Z_{Rx}<Z_{Ry}$ or $Z_{Rx}>Z_{Ry}$. The Rayleigh range can also be observed as the distance along the beam axis at which the optical intensity decays to one half of its value observed at the beam waist location (location of maximum intensity). Laser beams with large Rayleigh ranges have low divergence and expand more slowly with distance in the beam propagation direction than laser beams with small Rayleigh ranges.

The formulas above can be applied to any laser beam (not just Gaussian beams) by using the intensity profile I(x, y, z) that describes the laser beam. In the case of the $TEM_{00}$ mode of a Gaussian beam, the intensity profile is given by:

$$I(x, y) = \frac{\sqrt{\pi}}{2}w_o e^{\frac{-2(x^2+y^2)}{w_o^2}} \tag{17}$$

where $w_o$ is the radius (defined as the radius at which beam intensity decreases to $1/e^2$ of the peak beam intensity of the beam at a beam waist position $z_o$. From Equation (17) and the above formulas, we obtain the following results for a $TEM_{00}$ Gaussian beam:

$$\sigma_{0x}^2 = \sigma_{0y}^2 = \frac{w_o^2}{4} \tag{18}$$

$$\sigma_{\infty x}^2 = \sigma_{\infty y}^2 = \frac{1}{4\pi^2 w_o^2} \tag{19}$$

$$M_x^2 = 4\pi\sigma_{0x}\sigma_{\infty x} = 1 \tag{20}$$

$$M_y^2 = 4\pi\sigma_{0y}\sigma_{\infty y} = 1 \tag{21}$$

$$Z_{Rx} = \frac{4\pi\sigma_{0x}^2}{M_x^2\lambda} = \frac{\pi w_0^2}{\lambda} \tag{22}$$

$$Z_{Ry} = \frac{4\pi\sigma_{0y}^2}{M_y^2\lambda} = \frac{\pi w_0^2}{\lambda} \tag{23}$$

$$w^2(z) = w_0^2 + \frac{\lambda^2}{(\pi w_0)^2}(z-z_0)^2 = w_0^2\left[1 + \frac{(z-z_0)^2}{Z_R^2}\right] \tag{24}$$

where $Z_R=Z_{Rx}=Z_{Ry}$. For Gaussian beams, it is further noted that $M^2=M_x^2=M_y^2=1$.

Beam cross section is characterized by shape and dimensions. The dimensions of the beam cross section are characterized by a spot size of the beam. For a Gaussian beam, spot size is frequently defined as the radial extent at which the intensity of the beam decreases to $1/e^2$ of its maximum value, denoted in Equation (17) as $w_0$. The maximum intensity of a Gaussian beam occurs at the center (x=0 and y=0 (Cartesian) or r=0 (cylindrical)) of the intensity distribution and radial extent used to determine spot size is measured relative to the center.

Beams with axisymmetric (i.e. rotationally symmetric around the beam propagation axis Z) cross sections can be characterized by a single dimension or spot size that is measured at the beam waist location as specified in Section 3.12 of ISO 11146-1:2005(E). For a Gaussian beam, Equation (17) shows that spot size is equal to $w_0$, which from Equation (18) corresponds to $2\sigma_{0x}$ or $2\sigma_{0y}$. For an axisymmetric beam having an axisymmetric cross section, such as a circular cross section, $\sigma_{0x}=\sigma_{0y}$. Thus, for axisymmetric beams, the cross section dimension may be characterized with a single spot size parameter, where $w_o=2\sigma_0$. Spot size can be similarly defined for non-axisymmetric beam cross sections where, unlike an axisymmetric beam, $\sigma_{0x}\neq\sigma_{0y}$. Thus, when the spot size of the beam is non-axisymmetric, it is necessary to characterize the cross-sectional dimensions of a non-axisymmetric beam with two spot size parameters: $w_{ox}$ and $w_{oy}$ in the x-direction and y-direction, respectively, where $$w_{ox}=2\sigma_{0x} \tag{25}$$

$$w_{oy}=2\sigma_{0y} \tag{26}$$

Further, the lack of axial (i.e. arbitrary rotation angle) symmetry for anon-axisymmetric beam means that the results of a calculation of values of $\sigma_{0x}$ and $\sigma_{0y}$ will depend on the choice of orientation of the X-axis and Y-axis. ISO 11146-1:2005(E) refers to these reference axes as the principal axes of the power density distribution (Section 3.3-3.5) and in the following discussion we will assume that the X and Y axes are aligned with these principal axes. Further, an angle $\phi$ about which the X-axis and Y-axis may be rotated in the cross-sectional plane (e.g., an angle of the X-axis and Y-axis relative to reference positions for the X-axis and Y-axis, respectively) may be used to define minimum ($w_{o,min}$) and maximum values ($w_{o,max}$) of the spot size parameters for a non-axisymmetric beam:

$$w_{o,min} = 2\sigma_{0,min} \quad (27)$$

$$w_{o,max} = 2\sigma_{0,max} \quad (28)$$

where $2\sigma_{0,min} = 2\sigma_{0x}(\phi_{min,x}) = 2\sigma_{0y}(\phi_{min,y})$ and $2\sigma_{0,max} = 2\sigma_{0x}(\phi_{max,x}) = 2\sigma_{0y}(\phi_{max,y})$. The magnitude of the axial asymmetry of the beam cross section can be quantified by the aspect ratio, where the aspect ratio is defined as the ratio of $w_{o,max}$ to $w_{o,min}$. An axisymmetric beam cross section has an aspect ratio of 1.0, while elliptical and other non-axisymmetric beam cross sections have aspect ratios greater than 1.0, for example, greater than 1.1, greater than 1.2, greater than 1.3, greater than 1.4, greater than 1.5, greater than 1.6, greater than 1.7, greater than 1.8, greater than 1.9, greater than 2.0, greater than 3.0, greater than 5.0, greater than 10.0, or the like.

To promote uniformity of defects 172 in the beam propagation direction (e.g. depth dimension of the transparent workpiece 160), a laser beam 112 having low divergence may be used. In one or more embodiments, laser beams 112 having low divergence may be utilized for forming defects 172. As noted above, divergence can be characterized by the Rayleigh range. For non-axisymmetric beams, Rayleigh ranges for the principal axes X and Y are defined by Equations (15) and (16) for the X-direction and Y-direction, respectively, where it can be shown that for any real beam, $M_x^2 > 1$ and $M_y^2 > 1$ and where $\sigma_{0x}^2$ and $\sigma_{0y}^2$ are determined by the intensity distribution of the laser beam. For symmetric beams, Rayleigh range is the same in the X-direction and Y-direction and is expressed by Equation (22) or Equation (23). Low divergence correlates with large values of the Rayleigh range and weak diffraction of the laser beam.

Beams with Gaussian intensity profiles may be less preferred for laser processing to form defects 172 because, when focused to small enough spot sizes (such as spot sizes in the range of microns, such as about 1-5 µm or about 1-10 µm) to enable available laser pulse energies to modify materials such as glass, they are highly diffracting and diverge significantly over short propagation distances. To achieve low divergence, it is desirable to control or optimize the intensity distribution of the pulsed laser beam to reduce diffraction. Pulsed laser beams may be non-diffracting or weakly diffracting. Weakly diffracting laser beams include quasi-non-diffracting laser beams. Representative weakly diffracting laser beams include Bessel beams, Gauss-Bessel beams, Airy beams, Weber beams, and Mathieu beams.

For non-axisymmetric beams, the Rayleigh ranges $Z_{Rx}$ and $Z_{Ry}$ are unequal. Equations (15) and (16) indicate that $Z_{Rx}$ and $Z_{Ry}$ depend on $\sigma_{0x}$ and $\sigma_{0y}$, respectively, and above we noted that the values of $\sigma_{0x}$ and $\sigma_{0y}$ depend on the orientation of the X-axis and Y-axis. The values of $Z_{Rx}$ and $Z_{Ry}$ will accordingly vary, and each will have a minimum value and a maximum value that correspond to the principal axes, with the minimum value of $Z_{Rx}$ being denoted as $Z_{Rx,min}$ and the minimum value of $Z_{Ry}$ being denoted $Z_{Ry,min}$ for an arbitrary beam profile $Z_{Rx,min}$ and $Z_{Ry,min}$ can be shown to be given by $$Z_{Rx,min} = \frac{4\pi\sigma_{0,min}^2}{M_x^2\lambda} \quad (29)$$

and $$Z_{Ry,min} = \frac{4\pi\sigma_{0,min}^2}{M_y^2\lambda} \quad (30)$$

Since divergence of the laser beam occurs over a shorter distance in the direction having the smallest Rayleigh range, the intensity distribution of the laser beam 112 used to form defects 172 may be controlled so that the minimum values of $Z_{Rx}$ and $Z_{Ry}$ (or for axisymmetric beams, the value of $Z_R$) are as large as possible. Since the minimum value $Z_{Rx,min}$ of $Z_{Rx}$ and the minimum value $Z_{Ry,min}$ of $Z_{Ry}$ differ for a non-axisymmetric beam, a laser beam 112 may be used with an intensity distribution that makes the smaller of $Z_{Rx,min}$ and $Z_{Ry,min}$ as large as possible when forming damage regions.

In different embodiments, the smaller of $Z_{Rx,min}$ and $Z_{Ry,min}$ (or for axisymmetric beams, the value of $Z_R$) is greater than or equal to 50 µm, greater than or equal to 100 µm, greater than or equal to 200 µm, greater than or equal to 300 µm, greater than or equal to 500 µm, greater than or equal to 1 mm, greater than or equal to 2 mm, greater than or equal to 3 mm, greater than or equal to 5 mm, in the range from 50 µm to 10 mm, in the range from 100 µm to 5 mm, in the range from 200 µm to 4 mm, in the range from 300 µm to 2 mm, or the like.

The values and ranges for the smaller of $Z_{Rx,min}$ and $Z_{Ry,min}$ (or for axisymmetric beams, the value of $Z_R$) specified herein are achievable for different wavelengths to which the workpiece is transparent through adjustment of the spot size parameter $w_{o,min}$ defined in Equation (27). In different embodiments, the spot size parameter $w_{o,min}$ is greater than or equal to 0.25 µm, greater than or equal to 0.50 µm, greater than or equal to 0.75 µm, greater than or equal to 1.0 µm, greater than or equal to 2.0 µm, greater than or equal to 3.0 µm, greater than or equal to 5.0 µm, in the range from 0.25 µm to 10 µm, in the range from 0.25 µm to 5.0 µm, in the range from 0.25 µm to 2.5 µm, in the range from 0.50 µm to 10 µm, in the range from 0.50 µm to 5.0 µm, in the range from 0.50 µm to 2.5 µm, in the range from 0.75 µm to 10 µm, in the range from 0.75 µm to 5.0 µm, in the range from 0.75 µm to 2.5 µm, or the like.

Non-diffracting or quasi-non-diffracting beams generally have complicated intensity profiles, such as those that decrease non-monotonically vs. radius. By analogy to a Gaussian beam, an effective spot size $w_{o,eff}$ can be defined for non-axisymmetric beams as the shortest radial distance, in any direction, from the radial position of the maximum intensity (r=0) at which the intensity decreases to $1/e^2$ of the maximum intensity. Further, for axisymmetric beams $w_{o,eff}$ is the radial distance from the radial position of the maximum intensity (r=0) at which the intensity decreases to $1/e^2$ of the maximum intensity. A criterion for Rayleigh range based on the effective spot size $w_{o,eff}$ for non-axisymmetric beams or the spot size $w_o$ for axisymmetric beams can be specified as non-diffracting or quasi-non-diffracting beams for forming damage regions using equation (31) for non-axisymmetric beams of equation (32) for axisymmetric beams, below:

$$\text{Smaller of } Z_{Rx,min}, Z_{Ry,min} > F_D \frac{\pi w_{0,eff}^2}{\lambda} \quad (31)$$

$$Z_R > F_D \frac{\pi w_0^2}{\lambda} \quad (32)$$

where $F_D$ is a dimensionless divergence factor having a value of at least 10, at least 50, at least 100, at least 250, at least 500, at least 1000, in the range from 10 to 2000, in the range from 50 to 1500, in the range from 100 to 1000. By comparing Equation (31) to Equation (22) or (23), one can see that for a non-diffracting or quasi-non-diffracting beam the distance, Smaller of $Z_{Rx,min}$, $Z_{Ry,min}$ in Equation (31), over which the effective beam size doubles, is $F_D$ times the distance expected if a typical Gaussian beam profile were used. The dimensionless divergence factor $F_D$ provides a criterion for determining whether or not a laser beam is quasi-non-diffracting. As used herein, the laser beam 112 is considered quasi-non-diffracting if the characteristics of the laser beam satisfy Equation (31) or Equation (32) with a value of $F_D \geq 10$. As the value of $F_D$ increases, the laser beam 112 approaches a more nearly perfect non-diffracting state. Moreover, it should be understood that Equation (32) is merely a simplification of Equation (31) and as such, Equation (31) mathematically describes the dimensionless divergence factor $F_D$ for both axisymmetric and non-axisymmetric pulsed laser beams 112.

Figure 2:
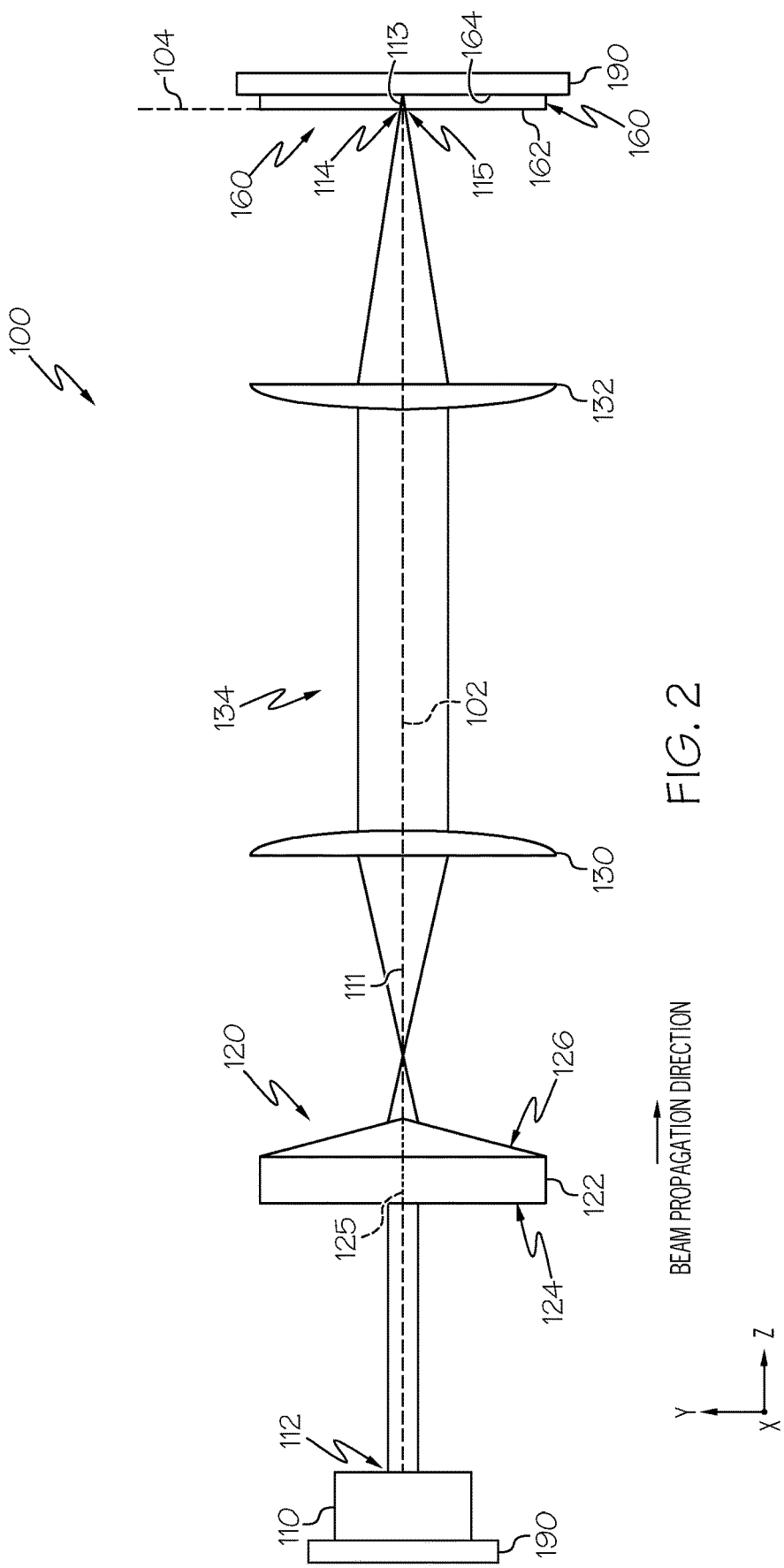
FIG. 2 shows an optical assembly for laser processing, according to one or more embodiments.

Referring now to FIG. 2, the figure shows an optical assembly 100 for producing a laser beam 112 that is quasi-non-diffracting and forms the laser beam focal line 113 at the transparent workpiece 160 using the aspheric optical element 120 (e.g., an axicon 122), according to one or more embodiments. The optical assembly 100 includes a beam source 110 that outputs the laser beam 112, first lens 130 and second lens 132. The beam source 110 may comprise any known or yet to be developed beam source 110 configured to output laser beams 112, for example, pulsed laser beams or continuous wave laser beams. In some embodiments, the beam source 110 may output a laser beam 112 comprising a wavelength of for example, 1064 nm, 1030 nm, 532 nm, 530 nm, 355 nm, 343 nm, or 266 nm, or 215 nm. Further, the laser beam 112 used to form defects 172 in the transparent workpiece 160 may be well suited for materials that are transparent to the selected pulsed laser wavelength.

Further, the transparent workpiece 160 may be positioned such that the laser beam 112 output by the beam source 110 irradiates the transparent workpiece 160, for example, after traversing the aspheric optical element 120 and thereafter, both the first lens 130 and the second lens 132. An optical axis 102 extends between the beam source 110 and the transparent workpiece 160 (along the Z-axis in the embodiment depicted in FIG. 2) such that when the beam source 110 outputs the laser beam 112, the beam pathway 111 of the laser beam 112 extends along the optical axis 102.

Suitable laser wavelengths for forming defects 172 are wavelengths at which the combined losses of linear absorption and scattering by the transparent workpiece 160 are sufficiently low. In embodiments, the combined losses due to linear absorption and scattering by the transparent workpiece 160 at the wavelength are less than 20%/mm, or less than 15%/mm, or less than 10%/mm, or less than 5%/mm, or less than 1%/mm, where the dimension "/mm" means per millimeter of distance within the transparent workpiece 160 in the beam propagation direction of the laser beam 112 (e.g., the Z direction). Representative wavelengths for many glass workpieces include fundamental and harmonic wavelengths of $Nd^{3+}$ (e.g. $Nd^{3+}$:YAG or $Nd^{3+}$:YVO$_4$ having fundamental wavelength near 1064 nm and higher order harmonic wavelengths near 532 nm, 355 nm, and 266 nm). Other wavelengths in the ultraviolet, visible, and infrared portions of the spectrum that satisfy the combined linear absorption and scattering loss requirement for a given substrate material can also be used.

In operation, the laser beam 112 output by the beam source 110 may create multi-photon absorption (MPA) in the transparent workpiece 160. MPA is the simultaneous absorption of two or more photons of identical or different frequencies that excites a molecule from one state (usually the ground state) to a higher energy electronic state (i.e., ionization). The energy difference between the involved lower and upper states of the molecule is equal to the sum of the energies of the involved photons. MPA, also called induced absorption, can be a second-order or third-order process (or higher order), for example, that is several orders of magnitude weaker than linear absorption. It differs from linear absorption in that the strength of second-order induced absorption may be proportional to the square of the light intensity, for example, and thus it is a nonlinear optical process.

The perforation step that creates the contour 170 (FIGS. 1A and 1B) may utilize the beam source 110 (e.g., a pulsed beam source such as an ultra-short pulse laser) in combination with the aspheric optical element 120, the first lens 130, and the second lens 132, to irradiate the transparent workpiece 160 and generate the laser beam focal line 113. The laser beam focal line 113 comprises a quasi-non-diffracting beam, such as a Gauss-Bessel beam or Bessel beam, as defined above, and may fully or partially perforate the transparent workpiece 160 to form defects 172 in the transparent workpiece 160, which may form the contour 170. In embodiments in which the laser beam 112 comprises a pulsed laser beam, the pulse duration of the individual pulses is in a range of from about 1 femtosecond to about 200 picoseconds, such as from about 1 picosecond to about 100 picoseconds, 5 picoseconds to about 20 picoseconds, or the like, and the repetition rate of the individual pulses may be in a range from about 1 kHz to 4 MHz, such as in a range from about 10 kHz to about 3 MHz, or from about 10 kHz to about 650 kHz.

Figures 3A, 3B:
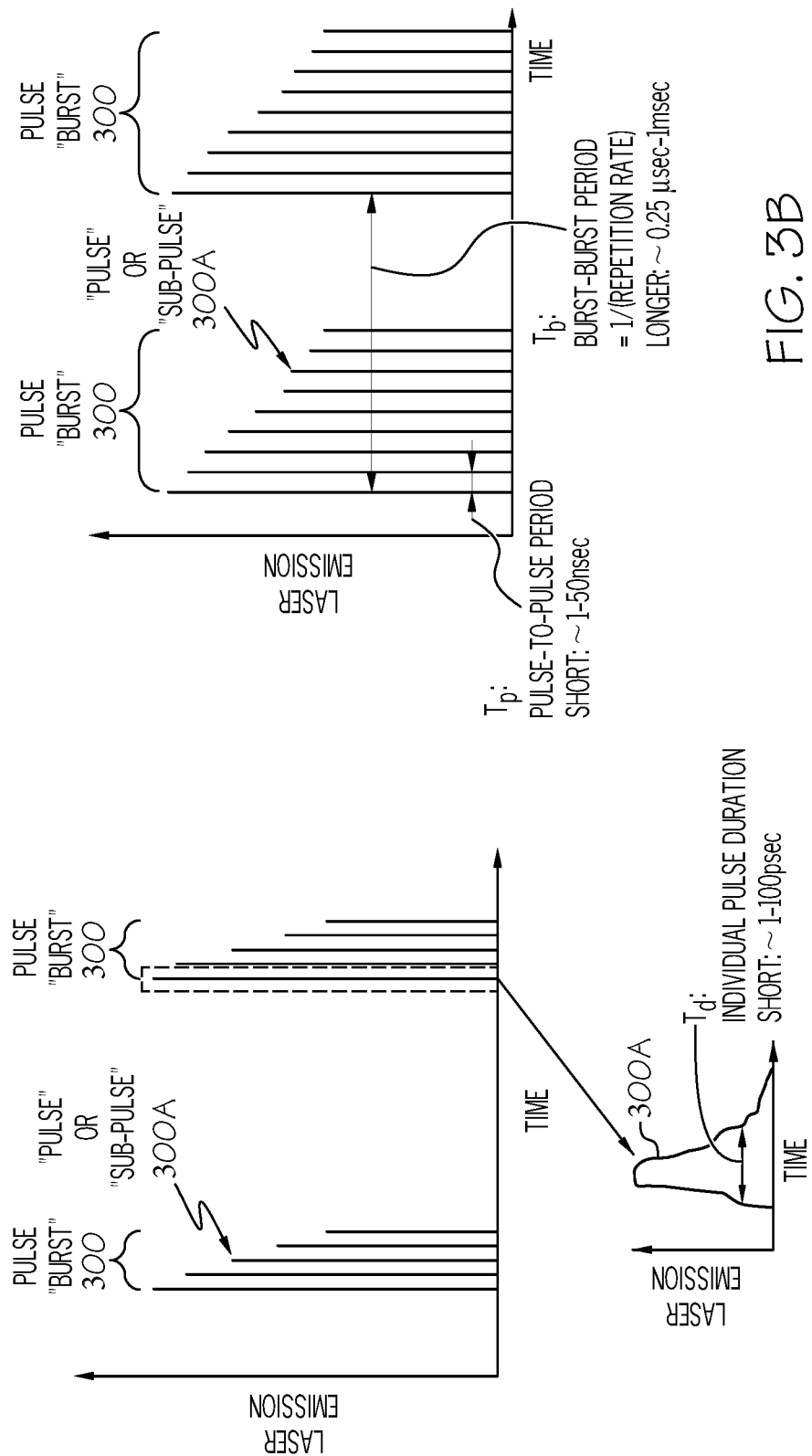
FIG. 3A shows a graph of relative intensity of laser pulses within an exemplary pulse burst vs. time, according to one or more embodiments.
FIG. 3B shows a graph of relative intensity of laser pulses vs. time within another exemplary pulse burst, according to one or more embodiments.

Referring now to FIGS. 3A and 3B, in addition to a single pulse operation at the aforementioned individual pulse repetition rates, in embodiments comprising a pulsed laser beam, the pulses may be produced in pulse burst 300 of two sub-pulses 300A or more (such as, for example, 3 sub-pulses, 4 sub-pulses, 5 sub-pulses, 10 sub-pulses, 15 sub-pulses, 20 sub-pulses, or more per pulse burst, such as from 1 to 30 sub-pulses per pulse burst 300, or from 5 to 20 sub-pulses per pulse burst 300). While not intending to be limited by theory, a pulse burst is a short and fast grouping of sub-pulses that creates an optical energy interaction with the material (i.e. MPA in the material of the transparent workpiece 160) on a time scale not easily accessible using a single-pulse operation. While still not intending to be limited by theory, the energy within a pulse burst (i.e. a group of pulses) is conserved. As an illustrative example, for a pulse burst having an energy of 100 µJ/burst and 2 sub-pulses, the 100 µJ/burst energy is split between the 2 pulses for an average energy of 50 µJ per sub-pulse and for a pulse burst having an energy of 100 µJ/burst and 10 sub-pulses, the 100 µJ/burst is split amongst the 10 sub-pulses for an average energy of 10 µJ per sub-pulse. Further, the energy distribution among the sub-pulses of a pulse burst does not need to be uniform. In fact, in some instances, the energy distribution among the sub-pulses of a pulse burst is in the form of an exponential decay, where the first sub-pulse of the pulse burst contains the most energy, the second sub-pulse of the pulse burst contains slightly less energy, the third sub-pulse of the pulse burst contains even less energy, and so on. However, other energy distributions within an individual pulse burst are also possible, where the exact energy of each sub-pulse can be tailored to effect different amounts of modification to the transparent workpiece 160.

While still not intending to be limited by theory, when the defects 172 of the one or more contour 170 are formed with pulse bursts having at least two sub-pulses, the force necessary to separate the transparent workpiece 160 along the contour 170 (i.e. the maximum break resistance) is reduced compared to the maximum break resistance of a contour 170 with the same spacing between adjacent defects 172 in an identical transparent workpiece 160 that is formed using a single pulse laser. For example, the maximum break resistance of a contour 170 formed using a single pulse is at least two times greater than the maximum break resistance of a contour 170 formed using a pulse burst having 2 or more sub-pulses. Further, the difference in maximum break resistance between a contour 170 formed using a single pulse and a contour 170 formed using a pulse burst having 2 sub-pulses is greater than the difference in maximum break resistance between a contour 170 formed using a pulse burst having 2 sub-pulses and a pulse burst having 3 sub-pulses. Thus, pulse bursts may be used to form contour 170 that separate easier than contour 170 formed using a single pulse laser.

Referring still to FIGS. 3A and 3B, the sub-pulses 300A within the pulse burst 300 may be separated by a duration that is in a range from about 1 nsec to about 50 nsec, for example, from about 10 nsec to about 30 nsec, such as about 20 nsec. In other embodiments, the sub-pulses 300A within the pulse burst 300 may be separated by a duration of up to 100 psec (for example, 0.1 psec, 5 psec, 10 psec, 15 psec, 18 psec, 20 psec, 22 psec, 25 psec, 30 psec, 50 psec, 75 psec, or any range therebetween). For a given laser, the time separation $T_p$ (FIG. 4B) between adjacent sub-pulses 300A within a pulse burst 300 may be relatively uniform (e.g., within about 10% of one another). For example, in some embodiments, each sub-pulse within a pulse burst 300 is separated in time from the subsequent sub-pulse by approximately 20 nsec (50 MHz). Further, the time between each pulse burst 300 may be from about 0.25 microseconds to about 1000 microseconds, e.g., from about 1 microsecond to about 10 microseconds, or from about 3 microseconds to about 8 microseconds.

In some of the exemplary embodiments of the beam source 110 described herein, the time separation $T_b$ (FIG. 3B) is about 5 microseconds for the beam source 110 outputting a laser beam 112 comprising a burst repetition rate of about 200 kHz. The laser burst repetition rate is related to the time $T_b$ between the first pulse in a burst to the first pulse in the subsequent burst (laser burst repetition rate=1/$T_b$). In some embodiments, the laser burst repetition rate may be in a range of from about 1 kHz to about 4 MHz. In embodiments, the laser burst repetition rates may be, for example, in a range of from about 10 kHz to about 650 kHz. The time $T_b$ between the first pulse in each burst to the first pulse in the subsequent burst may be from about 0.25 microsecond (4 MHz burst repetition rate) to about 1000 microseconds (1 kHz burst repetition rate), for example from about 0.5 microseconds (2 MHz burst repetition rate) to about 40 microseconds (25 kHz burst repetition rate), or from about 2 microseconds (500 kHz burst repetition rate) to about 20 microseconds (50 k Hz burst repetition rate). The exact timing, pulse duration, and burst repetition rate may vary depending on the laser design, but short pulses ($T_d$<20 psec and, in some embodiments, $T_d$≤15 psec) of high intensity have been shown to work particularly well.

The burst repetition rate may be in a range of from about 1 kHz to about 2 MHz, such as from about 1 kHz to about 200 kHz. Bursting or producing pulse burst 300 is a type of laser operation where the emission of sub-pulses 300A is not in a uniform and steady stream but rather in tight clusters of pulse burst 300. The pulse burst laser beam may have a wavelength selected based on the material of the transparent workpiece 160 being operated on such that the material of the transparent workpiece 160 is substantially transparent at the wavelength. The average laser power per burst measured at the material may be at least about 40 µJ per mm of thickness of material. For example, in embodiments, the average laser power per burst may be from about 40 µJ/mm to about 2500 µJ/mm, or from about 500 µJ/mm to about 2250 µJ/mm. In a specific example, for 0.5 mm to 0.7 mm thick Corning EAGLE XG® transparent workpiece, pulse bursts of from about 300 µJ to about 600 µJ may cut and/or separate the workpiece, which corresponds to an exemplary range of about 428 µJ/mm to about 1200 µJ/mm (i.e., 300 µJ/0.7 mm for 0.7 mm EAGLE XG® glass and 600 µJ/0.5 mm for a 0.5 mm EAGLE XG® glass).

The energy required to modify the transparent workpiece 160 is the pulse energy, which may be described in terms of pules burst energy (i.e., the energy contained within a pulse burst 300 where each pulse burst 300 contains a series of sub-pulses 300A), or in terms of the energy contained within a single laser pulse (many of which may comprise a burst). The pulse energy (for example, pulse burst energy) may be from about 25 µJ to about 750 µJ, e.g., from about 50 µJ to about 500 µJ, or from about 50 µJ to about 250 µJ. For some glass compositions, the pulse energy (e.g., pulse burst energy) may be from about 100 µJ to about 250 µJ. However, for display or TFT glass compositions, the pulse energy (e.g., pulse burst energy) may be higher (e.g., from about 300 µJ to about 500 µJ, or from about 400 µJ to about 600 µJ, depending on the specific glass composition of the transparent workpiece 160).

While not intending to be limited by theory, the use of a laser beam 112 comprising a pulsed laser beam capable of generating pulse bursts is advantageous for cutting or modifying transparent materials, for example glass (e.g., the transparent workpiece 160). In contrast with the use of single pulses spaced apart in time by the repetition rate of the single-pulsed laser, the use of a burst sequence that spreads the pulse energy over a rapid sequence of pulses within the burst allows access to larger timescales of high intensity interaction with the material than is possible with single-pulse lasers. The use of pulse bursts (as opposed to a single pulse operation) increases the size (e.g., the cross-sectional size) of the defects 172, which facilitates the connection of adjacent defects 172 when separating transparent workpiece 160 along the one or more contour 170, thereby minimizing unintended crack formation. Further, using a pulse burst to form defects 172 increases the randomness of the orientation of cracks extending outward from each defect into the bulk material of the transparent workpiece 160 such that individual cracks extending outward from defects 172 do not influence or otherwise bias the separation of the contour 170 such that separation of the defects 172 follows the contour 170, minimizing the formation of unintended cracks.

Referring again to FIG. 2, the aspheric optical element 120 is positioned within the beam pathway 111 between the beam source 110 and the transparent workpiece 160. In operation, propagating the laser beam 112, e.g., an incoming Gaussian beam, through the aspheric optical element 120 may alter the laser beam 112 such that the portion of the laser beam 112 propagating beyond the aspheric optical element 120 is quasi-non-diffracting, as described above. The aspheric optical element 120 may comprise any optical element comprising an aspherical shape. In some embodiments, the aspheric optical element 120 may comprise a conical wavefront producing optical element, such as an axicon lens, for example, a negative refractive axicon lens, a positive refractive axicon lens, a reflective axicon lens, a diffractive axicon lens, a programmable spatial light modulator axicon lens (e.g., a phase axicon), or the like.

In some embodiments, the aspheric optical element 120 comprises at least one aspheric surface whose shape is mathematically described as: $z'=(cr^2/1)+(1-(1+k)(c^2r^2))^{1/2}+(a_1r+a_2r^2+a_3r^3+a_4r^4+a_5r^5+a_6r^6+a_7r^7+a_8r^8+a_9r^9+a_{10}r^{10}+a_{11}r^{11}+a_{12}r^{12}$ where z' is the surface sag of the aspheric surface, r is the distance between the aspheric surface and the optical axis 102 in a radial direction (e.g., in an X-direction or a Y-direction), c is the surface curvature of the aspheric surface (i.e. $c_i=1/R_i$, where R is the surface radius of the aspheric surface), k is the conic constant, and coefficients $a_i$ are the first through the twelfth order aspheric coefficients or higher order aspheric coefficients (polynomial aspheres) describing the aspheric surface. In one example embodiment, at least one aspheric surface of the aspheric optical element 120 includes the following coefficients $a_1$-$a_7$, respectively: −0.085274788; 0.065748845; 0.077574995; −0.054148636; 0.022077021; −0.0054987472; 0.0006682955; and the aspheric coefficients $a_8$-$a_{12}$ are 0. In this embodiment, the at least one aspheric surface has the conic constant k=0. However, because the $a_1$ coefficient has a nonzero value, this is equivalent to having a conic constant k with a non-zero value. Accordingly, an equivalent surface may be described by specifying a conic constant k that is non zero, a coefficient $a_1$ that is non-zero, or a combination of a nonzero k and a non-zero coefficient $a_1$. Further, in some embodiments, the at least one aspheric surface is described or defined by at least one higher order aspheric coefficients $a_2$-$a_{12}$ with non-zero value (i.e., at least one of $a_2, a_3, \ldots, a_{12} \neq 0$). In one example embodiment, the aspheric optical element 120 comprises a third-order aspheric optical element such as a cubically shaped optical element, which comprises a coefficient $a_3$ that is non-zero.

In some embodiments, when the aspheric optical element 120 comprises an axicon 122 (as depicted in FIG. 2), the axicon 122 may have a laser output surface 126 (e.g., conical surface) having an angle of about 1.2°, such as from about 0.5° to about 5°, or from about 1° to about 1.5°, or even from about 0.5° to about 20°, the angle measured relative to the laser input surface 124 (e.g., flat surface) upon which the laser beam 112 enters the axicon 122. Further, the laser output surface 126 terminates at a conical tip. Moreover, the aspheric optical element 120 includes a centerline axis 125 extending from the laser input surface 124 to the laser output surface 126 and terminating at the conical tip. In other embodiments, the aspheric optical element 120 may comprise a waxicon, a spatial phase modulator such as a spatial light modulator, or a diffractive optical grating. In operation, the aspheric optical element 120 shapes the incoming laser beam 112 (e.g., an incoming Gaussian beam) into a quasi-non-diffracting beam, which, in turn, is directed through the first lens 130 and the second lens 132.

Referring still to FIG. 2, the first lens 130 is positioned upstream the second lens 132 and may collimate the laser beam 112 within a collimation space 134 between the first lens 130 and the second lens 132. Further, the second lens 132 may focus the laser beam 112 into the transparent workpiece 160, which may be positioned at an imaging plane 104. In some embodiments, the first lens 130 and the second lens 132 each comprise plano-convex lenses. When the first lens 130 and the second lens 132 each comprise plano-convex lenses, the curvature of the first lens 130 and the second lens 132 may each be oriented toward the collimation space 134. In other embodiments, the first lens 130 may comprise other collimating lenses and the second lens 132 may comprise a meniscus lens, an asphere, or another higher-order corrected focusing lens.

Current methods for laser processing workpieces are limited to forming simple cylindrical defects in the workpieces. Also, laser processing workpieces with existing components (e.g., electrical traces) can cause incidental laser exposure of the components, causing defects in the device. A benefit of generating a focal line with a freeform shape is that it can allow selective formation of custom defect geometries in a workpiece. It may also allow for faster manufacture and/or reduce the cost of manufacture of transparent articles. Some embodiments discussed herein present optical assemblies and methods for generating a focal line of a quasi-non-diffracting beam having a freeform shape. Other embodiments discussed herein present substrate articles produced by using the optical assemblies and methods.

Figure 4:
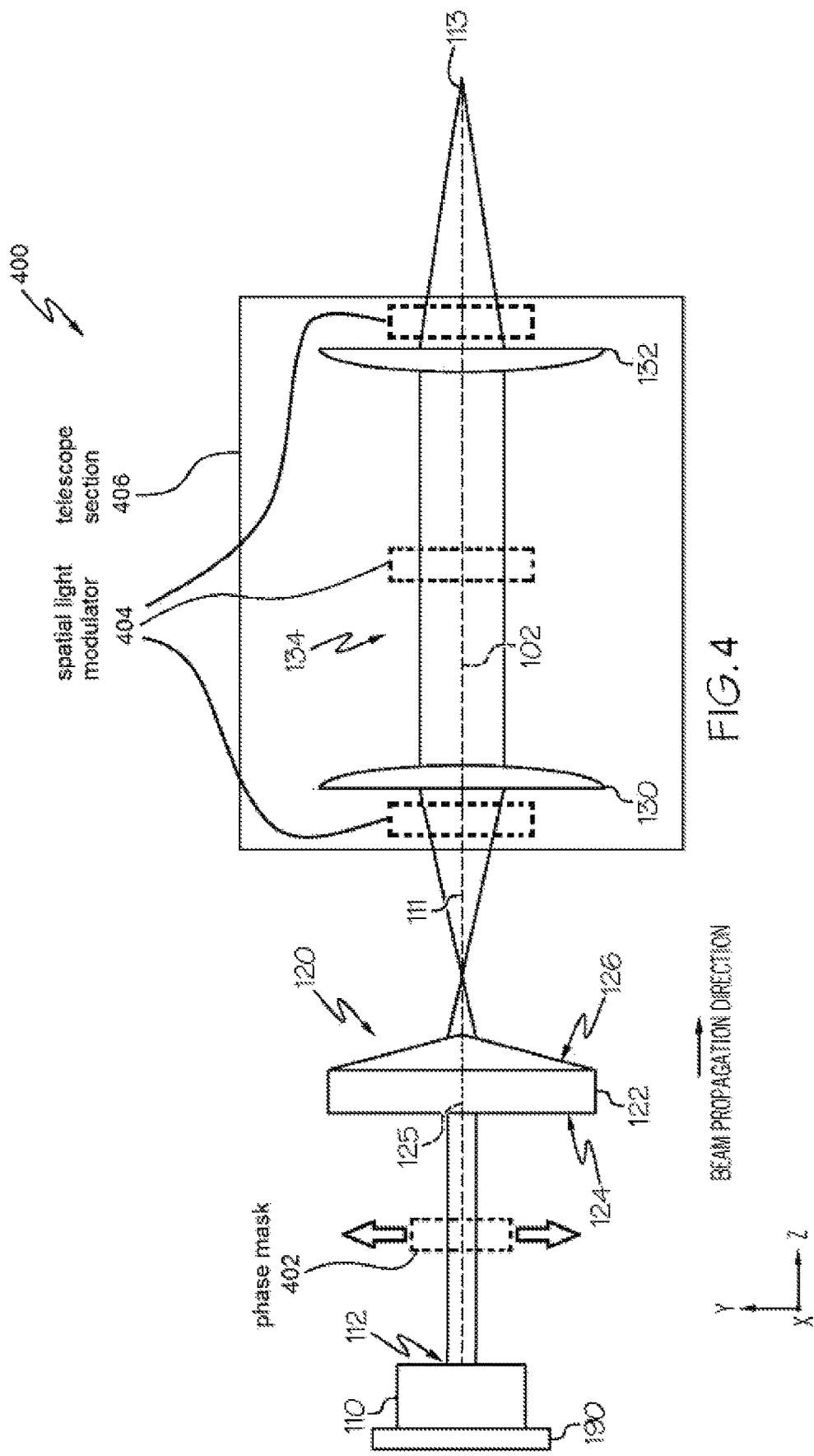
FIG. 4 shows an optical assembly for producing a laser beam, according to one or more embodiments.

FIG. 4 shows an optical assembly 400 for producing a laser beam, according to one or more embodiments. Unless otherwise indicated, the following structural description of FIG. 4 uses some of the same structural elements used in FIG. 2, particularly elements sharing the same number. In FIG. 4, elements relating to the workpiece and translation table are not shown for ease of discussion and clarity. In addition to the structural elements described for FIG. 2, in some embodiments, optical assembly 400 comprises a phase mask 402, a spatial light modulator 404, and a telescope section 406. FIG. 4 shows three possible positions for spatial light modulator 404, which will be explained below. Telescope section 406 includes the first lens 130, the second lens 132, the collimation space 134, and, in embodiments including the spatial light modulator 404. In some embodiments, either of phase mask 402 or spatial light modulator 404 may be omitted from optical assembly 400.

In some embodiments, the phase mask 402 is disposed upstream of the aspheric optical element 120. Spatial light modulator 404 is disposed downstream of first lens 130 and upstream of second lens 132. In another embodiment, phase mask 402 and spatial light modulator 404 are positioned differently, for example, due to structural constraints of a given laser design. Therefore, for example, spatial light modulator 404 may be optionally disposed upstream of first lens 130 or downstream of second lens 132.

Those skilled in the art will appreciate that other arrangements are possible for phase mask 402 and spatial light modulator 404. For example, in some embodiments, a phase mask 402 has an optical center (not shown) that is substantially aligned on the optical axis 102. The phase mask 402 can be moved perpendicular to optical axis 102 so as to off-center the optical center of phase mask 402 with respect to the optical axis 102. In some embodiments, the phase mask 402 is disposed upstream of the aspheric optical element 120. Spatial light modulator 404 is disposed downstream of first lens 130 and upstream of second lens 132. In some embodiments, phase mask 402 and spatial light modulator 404 are positioned differently, for example, due to structural constraints of a given laser design. Therefore, for example, spatial light modulator 404 may be optionally disposed upstream of first lens 130 or downstream of second lens 132. Those skilled in the art will appreciate that other arrangements are possible for phase mask 402 and spatial light modulator 404. In some embodiments, a phase mask 402 has an optical center (not shown) that is substantially aligned on the optical axis 102. The phase mask 402 can be moved perpendicular to optical axis 102 so as to off-center the optical center of phase mask 402 with respect to the optical axis 102.

Spatial light modulator 404 may also be referred to as an adjustable blocking element, for its function to adjust and selectively block portions of the laser beam 112. In some embodiments, spatial light modulator 404 is a liquid crystal element. The liquid crystal element comprises a grid of adjustable pixels. Each pixel may be programmed to block or allow transmission of a portion of laser beam 112 in response to an electrical input.

In other embodiments, spatial light modulator 404 is a body having a fixed pattern of non-transmissive portions and transmissive portions that block or transmit laser beam 112. Spatial light modulator 404 can be translated and/or rotated so as to adjust a spatial distribution of laser beam 112 that is transmitted through spatial light modulator 404. Examples of adjustable blocking elements having a fixed transmissive/ blocking pattern can be found in US2018/0093914, the disclosure of which is incorporated herein by reference in its entirety.

In some quasi-non-diffracting laser systems, the laser beam focal line (e.g., laser beam focal line 113) is shaped as a circular cylinder. The circular cylinder has a circular cross section with radius $w_o$ and a length $Z_R$ (e.g., Rayleigh length). In some embodiments, a laser system is capable of generating laser beam focal line shaped as an elliptic cylinder—having an elliptic or non-axisymmetric cross section. Non-axisymmetric cross sections can be achieved by using a blocking element to block the laser (e.g., laser beam 112) upstream of the focal line (e.g., laser beam focal line 113). Some examples of blocking elements can be found in US2018/0093914. Embodiments disclosed herein provide laser systems and methods that can generate a laser beam focal line 113 that has a freeform shape, that is, a volume that is different than simply a single circular cylinder or a single elliptic cylinder. For example, a freeform shape may include an hourglass shape, an hourglass shape with elliptical cross section, a reverse hourglass shape, a reverse hourglass shape with elliptical cross section, a cone, a cone with an elliptical cross section, or a combination of elliptical cross section and circular cross section. Because such laser beam focal line 113 has a freeform shape, laser beam focal line 113 may also be referred to as having a freeform energy distribution. It is to be understood that boundaries of a freeform energy distribution, being a volume of laser energy, are defined by laser intensity. In particular, the freeform energy distribution is the volume that includes a laser intensity above a threshold at which laser absorption is induced (e.g., multi-photon absorption) in a transparent material. Those skilled in the art will appreciate that the threshold intensity is dependent on the transparent material, as each material may have a unique threshold intensity as a function of laser wavelength.

In some embodiment, the modification of laser beam focal line 113 is achieved by adjustments of phase mask 402 and/or spatial light modulator 404. Phase mask 402, for example, delays a phase of selected cross-sectional portions of laser beam 112. When the different portions of laser beam 112 with different phases recombine to form laser beam focal line 113, the phase adjustments introduced by phase mask 402 produces regions of constructive and/or destructive interference along laser beam focal line 113. Controlling the locations of the constructive and/or destructive interferences allows the generation of laser beam focal line 113 having a freeform energy distribution. Spatial light modulator 404 has a similar function of controlling how light arrives to form laser beam focal line 113, but instead of controlling phases, spatial light modulator 404 blocks or transmits selected cross-sectional portions of laser beam 112. Either or both of phase mask 402 and spatial light modulator 404 may be used to achieve a freeform shape of laser beam focal line 113.

Figure 5:
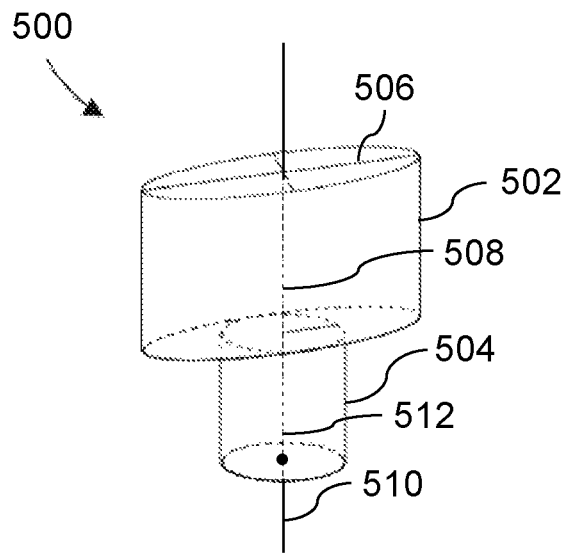
FIGS. 5 to 8 show freeform energy distributions, according to one or more embodiments.

FIG. 5 shows a freeform energy distribution 500, according to one or more embodiments. In some embodiments, freeform energy distribution 500 comprises an elliptic cylinder portion 502 and a circular cylinder portion 504. Elliptic cylinder portion 502 comprises an elliptic cross section, having a major axis 506, and a longitudinal axis 508 along an optical axis 510. Circular cylinder portion 504 comprises a longitudinal axis 512 along the optical axis 510. For clarity, freeform energy distribution 500 is shown as having a sharp contrast between elliptic cylinder portion 502 and circular cylinder portion 504. However, it should be appreciated that a graduated transition may exist between elliptic cylinder portion 502 and circular cylinder portion 504. The graduated transition may be present due to, for example, optical limitations of the laser system that generates freeform energy distribution 500.

In some embodiments, freeform energy distribution 500 is oriented such that elliptic cylinder portion 502 is disposed upstream of circular cylinder portion 504. In other embodiments, the opposite orientation is generated, where elliptic cylinder portion 502 is downstream of circular cylinder portion 504. The selection of these orientations is achieved by using alternate types of aspheric optical element 120 (e.g., axicon). For example, a typical axicon has a flat side and, opposite the flat side, a protruding (convex) conical section. In another embodiment, a reverse, or hollow, axicon may be used instead. A reverse axicon is one that has a flat side and a hollowed (concave) conical section. By switching between an axicon and a reverse axicon, the upstream/ downstream cylinder portions (e.g., elliptic or circular) are controlled.

Figure 6:
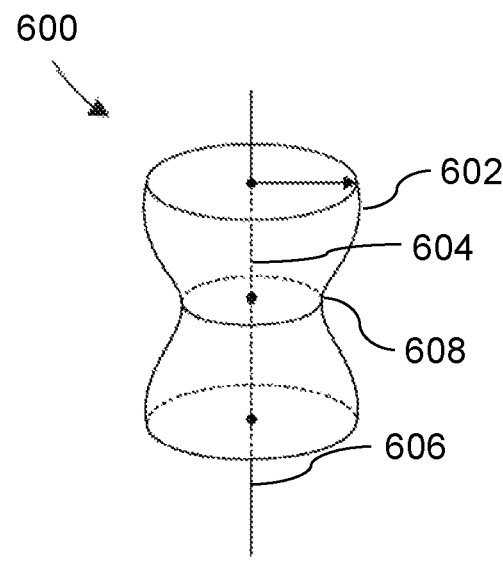

FIG. 6 shows a freeform energy distribution 600, according to one or more embodiments. In some embodiments, freeform energy distribution 600 comprises an hourglass shape 602. Hourglass shape 602 comprises a longitudinal axis 604 along optical axis 606. Hourglass shape 602 comprises a circular cross section that varies in size along longitudinal axis 604 and has a waist 608 that is flanked by wider portions. For clarity, freeform energy distribution 600 is shown as having abrupt cutoffs at the top and bottom boundaries. It should be appreciated that the top and bottom boundaries may be graduated. The graduated transition may be present due to, for example, optical limitations of the laser system that generates freeform energy distribution 600.

Figure 7:
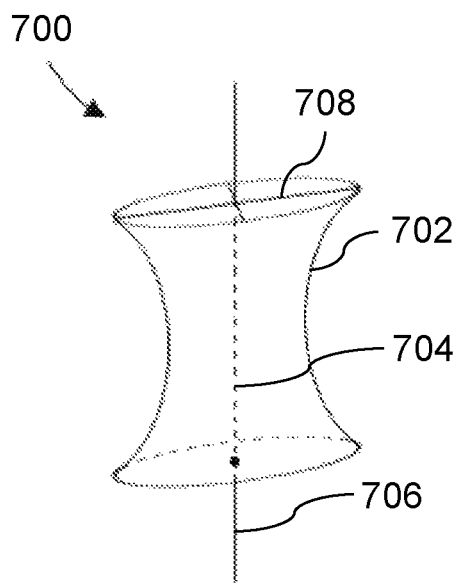

FIG. 7 shows a freeform energy distribution 700, according to one or more embodiments. In some embodiments, freeform energy distribution 700 comprises an hourglass shape 702. Hourglass shape 702 comprises a longitudinal axis 704 along an optical axis 706. Hourglass shape 702 comprises an elliptical cross section having a major axis 708, which scales in size along longitudinal axis 704. Hourglass shape 702 has a waist that is flanked by wider portions. For clarity, freeform energy distribution 700 is shown as having abrupt cutoffs at the top and bottom boundaries. It should be appreciated that the top and bottom boundaries may be graduated. The graduated transition may be present due to, for example, optical limitations of the laser system that generates freeform energy distribution 700.

Figure 8:
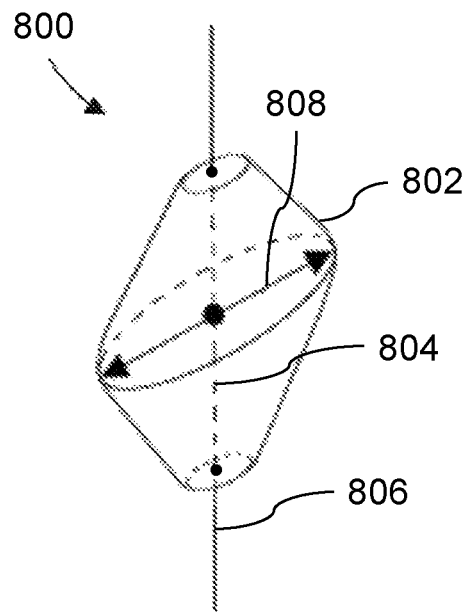

FIG. 8 shows a freeform energy distribution 800, according to one or more embodiments. In some embodiments, freeform energy distribution 800 comprises a reverse hourglass shape 802 (e.g., also vase or diamond shape). Reverse hourglass shape 802 comprises a longitudinal axis 804 along an optical axis 806. Reverse hourglass shape 802 comprises an elliptical cross section having a major axis 808, which scales in size along longitudinal axis 804. Those skilled in the art will appreciate that a circular cross section is also possible, as was shown for the hourglass embodiments shown in FIGS. 6 and 7. Reverse hourglass shape 802 has a wide central portion that is flanked by narrower portions. The freeform energy distributions shown in FIGS. 5-8 are achieved, for example, with adjustments of a phase mask and/or spatial light modulator (e.g., phase mask 402 and/or spatial light modulator 404 of FIG. 4).

Laser systems and methods described herein may be used to form defects in transparent materials. For example, in reference to FIG. 1A, defects 172 were described in the context of cutting or dividing transparent workpiece 160 along contour line 165. In this, and other applications, it may be advantageous to shape defects different from circular cylinders. Embodiments of laser systems and methods described herein may be used on a workpiece to form hidden separation features. The hidden separation features comprise defects with a specific shape that promote a desired crack propagation and remain fully within the workpiece (i.e., defects do not reach the surface of the transparent workpiece). To form defects having a freeform shape, regions on a substrate are exposed to a freeform energy distribution. The freeform energy distribution has energy sufficient to induce MPA in a region of the workpiece that is co-located with the freeform energy distribution.

Figure 10:
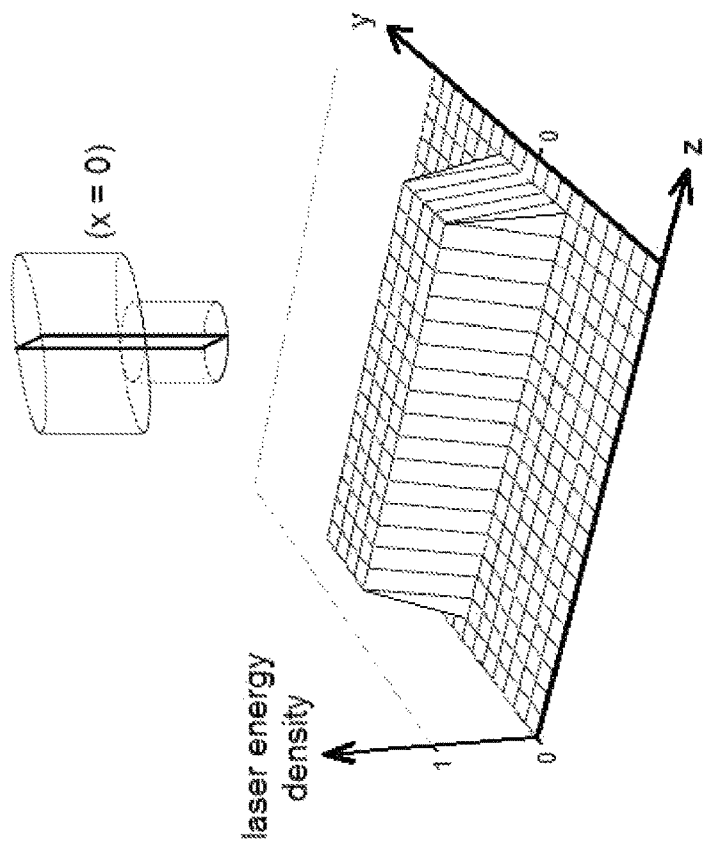
FIGS. 9 and 10 show graphs of laser energy density of a cross section of freeform energy distribution, according to one or more embodiments.
Figure 9:
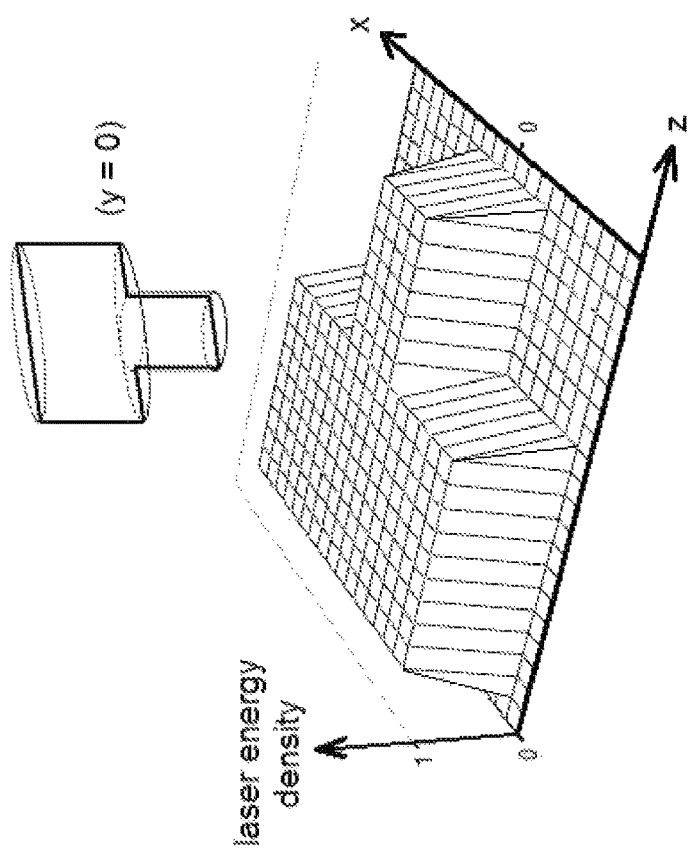

FIG. 9 shows a graph of laser energy density of a cross section of a freeform energy distribution, e.g., freeform energy distribution 500 (FIG. 5), according to one or more embodiments. The laser energy density is represented in binary value, where a value of 1 corresponds to a laser energy density exceeding a threshold leading to MPA and a value of 0 corresponding to a laser energy insufficient to induce MPA. The z-axis corresponds to the direction of laser propagation (e.g., optical axis 510 of FIG. 5). The y-axis lies along the direction of major axis 506 (FIG. 5). The x-axis corresponds to a minor axis that is perpendicular to major axis 506 (FIG. 5). The graph in FIG. 9 shows the laser intensity of the cross section of freeform energy distribution 500 (FIG. 5), the cross section lying on the plane defined at y=0. FIG. 10 shows a graph of laser energy density of another cross section of freeform energy distribution 500 (FIG. 5), according to one or more embodiments. The graph in FIG. 10 corresponds to the cross section of freeform energy distribution 500 lying on the plane defined at x=0. Those skilled in the art will appreciate that freeform energy distribution 600 (FIG. 6), freeform energy distribution 700 (FIG. 7), and freeform energy distribution 800 (FIG. 8) have corresponding graphical representations of laser energy density.

Methods of Laser Processing

A method for laser processing a workpiece uses laser systems disclosed herein, e.g., optical assembly 400. In some embodiments, the method comprises generating a beam of radiation and forming a defect in or on an object. The beam of radiation comprises a quasi-non-diffracting beam and a focal volume having a freeform energy distribution. The step of forming the defect comprises directing the beam onto the object and positioning the focal volume partially or fully within the object. The step of generating the beam comprises partially blocking the beam of radiation upstream of the cross section and/or spatially modulating a phase of the beam of radiation upstream of the cross section.

In some embodiments, the step of partially blocking the beam of radiation is performed using an adjustable blocking element (e.g., spatial light modulator 404 of FIG. 4). The step of partially blocking the beam of radiation comprises adjusting the adjustable blocking element to selectively block a portion of the beam of radiation. This allows adjustment an axial symmetry of the freeform energy distribution with respect to an optical axis of the beam of radiation. The step of modulating the phase of the beam of radiation is performed using a phase mask (e.g., phase mask 402 of FIG. 4). The step of spatially modulating the beam of radiation comprises moving an optical center of the phase mask away from the optical axis. This allows adjusting a geometry of the freeform energy distribution. The freeform energy distribution has energy sufficient to at least induce MPA in a region of the object that is co-located with the focal volume. The resulting induced MPA produces the defect and the defect comprises a shape that is substantially similar to the freeform energy distribution.

In some embodiments, the quasi-non-diffracting beam comprises a wavelength λ, a spot size $w_o$, and the cross section. The cross section comprises a Rayleigh range $Z_R$ that is greater than $$F_D \frac{\pi w_0^2}{\lambda},$$

where $F_D$ is a dimensionless divergence factor having a value greater than approximately 10.

In some embodiments, the freeform energy distribution comprises a first cross section and a second cross section parallel to the first cross section. The first cross section is geometrically dissimilar from the second cross section. In other words, the first and second cross sections are shaped such that no amount of scaling to either the first or second cross sections can cause the first and second cross sections to become identical. For example, in some embodiments, the freeform energy distinct circular cylinder and elliptic cylinder portions (e.g., freeform energy distribution 500 of FIG. 5). The circular and elliptic cylinder each have a longitudinal axis along the optical axis.

In some embodiments, the freeform energy distribution comprises an hourglass shape having a longitudinal axis along the optical axis. The hourglass shape may have a circular cross section (e.g., freeform energy distribution 600 of FIG. 6) or an elliptical cross section (e.g., freeform energy distribution 700 of FIG. 7). In some embodiments, the freeform energy distribution comprises a reverse hourglass shape (e.g., freeform energy distribution 800 of FIG. 8) having a longitudinal axis along the optical axis. The reverse hourglass shape may have a circular or elliptical cross section.

In some embodiments, the radiation comprises a wavelength in a range between approximately 250 nm to 2.0 µm. In some embodiments, the formed defect comprises a break feature, a cavity, or both. The rate of defect formation is greater than approximately 1000 defects per minute. In some embodiments, the defects may be formed using a single laser pulse. In some embodiments, the defects may be formed without rastering the beam of radiation relative to the workpiece.

In some embodiments, the defect comprises a break feature, a cavity, or both. In some embodiments the object comprises a transparent substrate.

Laser Processed Articles

In some embodiments, the methods disclosed herein allow fabrication of transparent, laser-processed articles that are difficult or otherwise impossible to produce by the known methods. The methods may also allow for faster manufacture and/or reduce the cost of manufacture of transparent articles. The transparent articles can be tailored to various applications, e.g., electronic devices on substrates having more precise crack propagation or hidden (e.g., latent/delayed) crack propagation features, medical wellplate with custom-shaped receptacles, circuit boards having high dielectric breakdown and improved hermetic seals, among others.

Before discussing further embodiments, it is informative to briefly describe etching techniques. A defect formed in a substrate can be hollowed out (e.g., via etching) or be left as damaged material within the defect. Depending on the application, a substrate can benefit from having a choice of forming hollowed defects or leaving the defects as solid material. In the scenario where hollowed defects are desired, the substrate is etched after the defects are formed by laser exposure. For example, a substrate is submersed in a liquid etchant. While the etchant is capable of dissolving the substrate at a given rate, the etchants in contact with the defect region dissolve the defect material at a faster rate than non-defective material—the phenomenon is called selective etching. Without wishing to be bound by theory, selective etching can be promoted by broken chemical bonds within the defect induced by laser exposure of the substrate material. A freeform energy distributions allows selective etching of custom geometries in a substrate.

Figure 11:
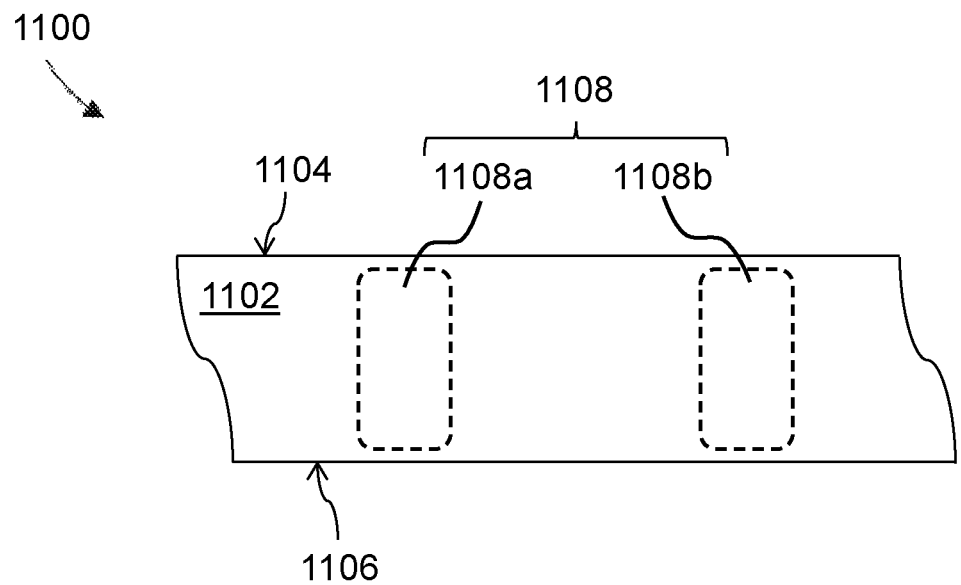
FIGS. 11 to 20 show sections of a substrate, according to one or more embodiments.

FIG. 11 shows a section of a substrate 1100, according to one or more embodiments. In some embodiments, substrate 1100 (e.g., transparent workpiece) comprises a body 1102, a first surface 1104, a second surface 1106, and a plurality of defects 1108 (e.g., modified regions). Plurality of defects 1108 comprises at least a first defect 1108a and a second defect 1108b. First defect 1108a and second defect 1108b are disposed between first surface 1104 and second surface 1106. In particular, first defect 1108a and second defect 1108b are disposed partially (e.g., intersecting a surface, recess) or fully within body 1102. First defect 1108a and second defect 1108b are separated from each other by a distance. In some embodiments, first defect 1108a and second defect 1108b are configured to be etched. First defect 1108a and second defect 1108b may comprise damaged material of the substrate 1100. In other embodiments, first defect 1108a and second defect 1108b are etched, and are thus void (e.g., cavity) and/or have remaining particulates of substrate material.

Figure 12:
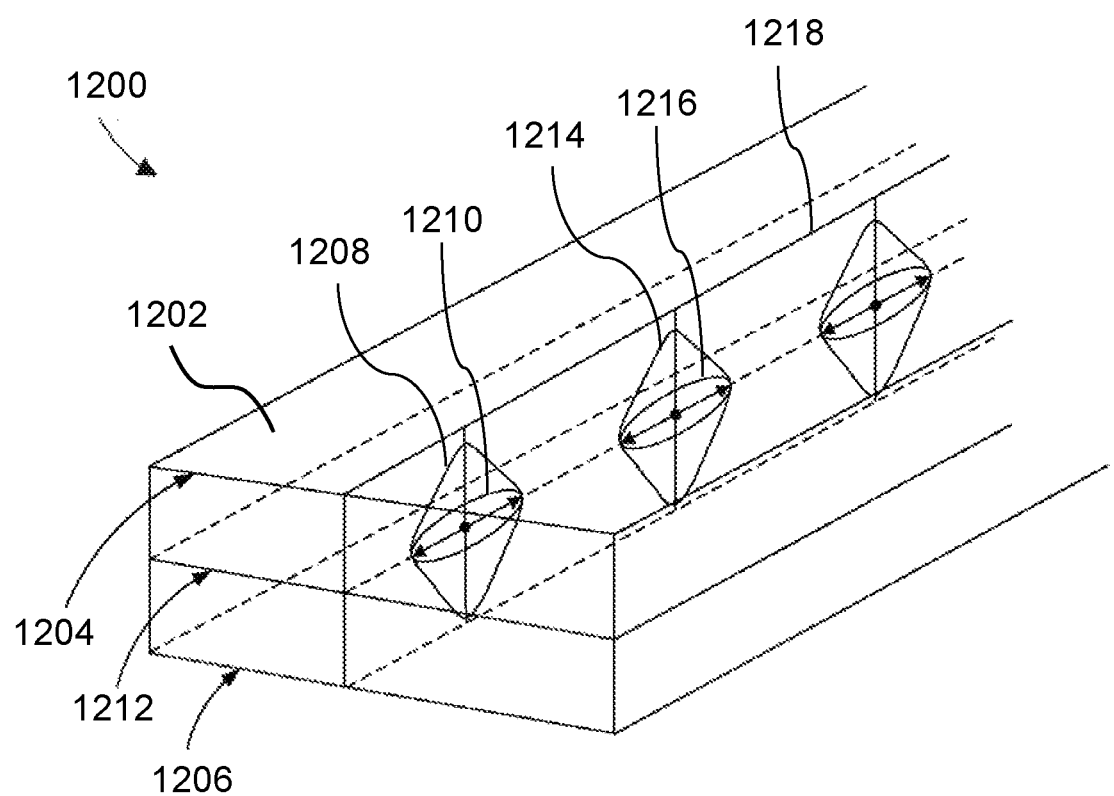

FIG. 12 shows a section of a substrate 1200, according to one or more embodiments. In some embodiments, substrate 1200 comprises a body 1202, a first surface 1204, a second surface 1206, and a first defect 1208. First defect 1208 comprises a cross section 1210. Substrate 1200 comprises a middle plane 1212 that is defined approximately equidistant from first surface 1204 and second surface 1206. In some embodiments, substrate 1200 comprises a second defect 1214. Second defect 1214 comprises a cross section 1216. Substrate 1200 comprises a contour 1218 (e.g., a break or separation feature).

In some embodiments, first surface 1204 is opposite second surface 1206. First surface 1204 is substantially parallel to second surface 1206. First defect 1208 and second defect 1214 (e.g., modified regions) are disposed between first surface 1204 and second surface 1206. Cross section 1210 and cross section 1216 are parallel to first surface 1204. In some embodiments, first defect 1208 and second defect 1214 comprise freeform shapes. The freeform shape of first defect 1208 comprises a reverse hourglass shape with an elliptical cross section (e.g., formed using freeform energy distribution 800). Cross section 1210 is said elliptical cross section of first defect 1208. That is, cross section 1210 is defined by a boundary of the freeform shape of defect 1208. The freeform shape of first defect 1214 comprises a reverse hourglass shape with an elliptical cross section (e.g., formed using freeform energy distribution 800). Cross section 1216 is said elliptical cross section of second defect 1214. That is, cross section 1216 is defined or enclosed by a boundary of the freeform shape of defect 1208. In other embodiments, cross section 1210 and cross section 1216 are circular.

The reverse hourglass shapes of first defect 1208 and second defect 1214 may be described in an alternative fashion. For example, while cross section 1210 is shown approximately at middle plane 1212, cross section 1210 may actually be drawn at any distance from first surface 1204. If cross section 1210 is drawn further away from middle plane 1212 (e.g., closer to first surface 1204), then the size of cross section 1210 is reduced. In this scenario, the size of cross section 1210 can be viewed as a 'sliding' parameter that scales as a function of the distance of cross section 1210 measured from, and perpendicular to, first surface 1204. In some embodiments, the size of cross section 1210 increases as the distance of cross section 1210 approaches the middle plane. This is true whether the distance of cross section 1210 approaches the middle plane from first surface 1204 or from second surface 1206, which describes a reverse hourglass shape. Those skilled in art will appreciate that in the scenario of a cylindrical defect (e.g., produced by a focal line 113 of FIG. 2), the size of a cross section remains substantially constant at any distance from a first, second, or middle surface/plane.

In some embodiments, first defect 1208 and second defect 1214 are aligned along contour 1218. Contour 1218 is straight or curved. Contour 1218 may also have both straight and curved sections. In some embodiments, cross section 1210 and cross section 1216 each comprises a major axis. Elliptical cross sections promote preferred directions of crack propagation, in particular, in the direction of the major axes of the elliptical cross sections. Therefore, major axes of cross section 1210 and cross section 1216 are aligned approximately along contour 1218.

Figure 13:
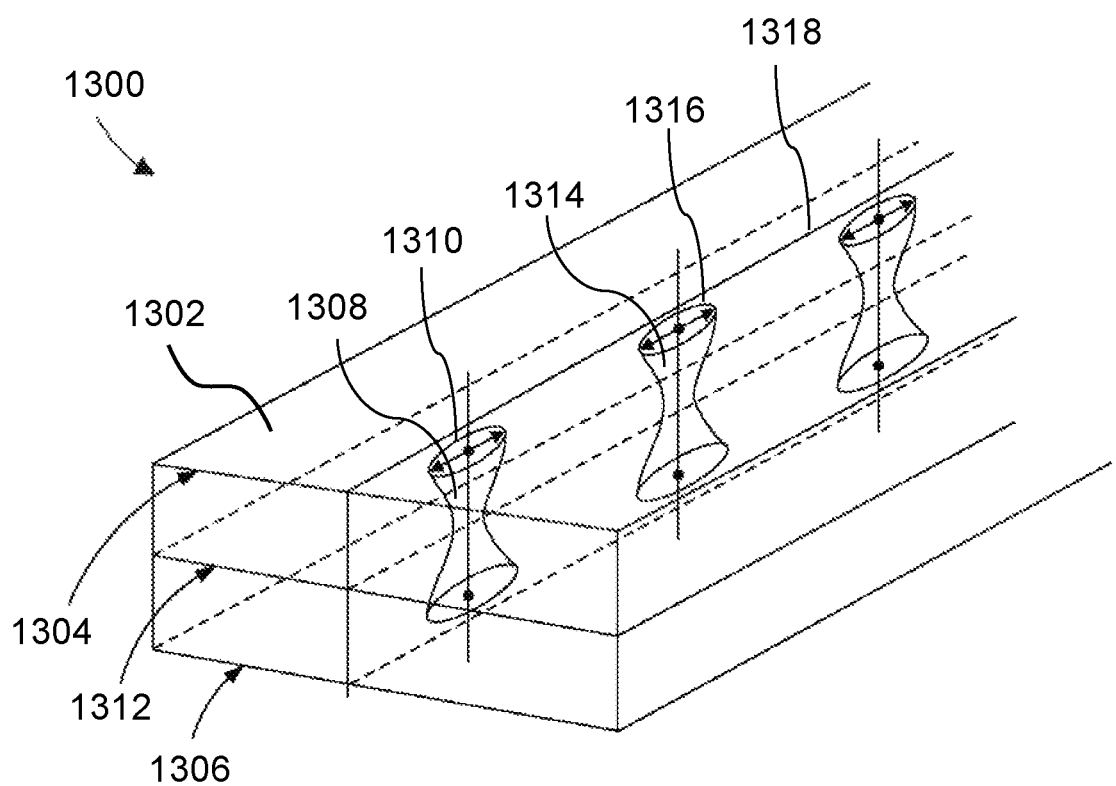

FIG. 13 shows a section of a substrate 1300, according to one or more embodiments. In some embodiments, substrate 1300 comprises a body 1302, a first surface 1304, a second surface 1306, and a first defect 1308. First defect 1308 comprises a cross section 1310. Substrate 1300 comprises a middle plane 1312 that is defined approximately equidistant from first surface 1304 and second surface 1306. In some embodiments, substrate 1300 comprises a second defect 1314. Second defect 1314 comprises a cross section 1316. Substrate 1300 comprises a contour 1318.

In some embodiments, first surface 1304 is opposite second surface 1306. First surface 1304 is substantially parallel to second surface 1306. First defect 1308 and second defect 1314 are disposed between first surface 1304 and second surface 1306. Cross section 1310 and cross section 1316 are parallel to first surface 1304. In some embodiments, first defect 1308 and second defect 1314 comprise freeform shapes. The freeform shape of first defect 1308 comprises an hourglass shape with an elliptical cross section (e.g., formed using freeform energy distribution 700). Cross section 1310 is said elliptical cross section of first defect 1308. That is, cross section 1310 is defined by a boundary of the freeform shape of first defect 1308. The freeform shape of first defect 1308 comprises an hourglass shape with an elliptical cross section (e.g., formed using freeform energy distribution 700). Cross section 1316 is said elliptical cross section of second defect 1314. That is, cross section 1316 is defined or enclosed by a boundary of the freeform shape of second defect 1314. In other embodiments, cross section 1310 and cross section 1316 are circular.

The hourglass shapes of first defect 1308 and second defect 1314 may be described in an alternative fashion. For example, while cross section 1310 is shown nearer to first surface 1304, cross section 1310 may actually be drawn at any distance from first surface 1304. If cross section 1310 is drawn further away from middle plane 1312, then the size of cross section 1310 is increased. In this scenario, the size of cross section 1310 can be viewed as a 'sliding' parameter that scales as a function of the distance of cross section 1310 measured from, and perpendicular to, first surface 1304. In some embodiments, the size of cross section 1310 decreases as the distance of cross section 1310 approaches the middle plane. This is true whether the distance of cross section 1310 approaches the middle plane from first surface 1304 or from second surface 1306, which describes an hourglass shape.

In some embodiments, first defect 1308 and second defect 1314 are aligned along contour 1318. Contour 1318 is straight or curved. Contour 1318 may also have both straight and curved sections. In some embodiments, cross section 1310 and cross section 1316 each comprise a major axis. Elliptical cross sections promote preferred directions of crack propagation, in particular, in the direction of the major axes of the elliptical cross sections. Therefore, major axes of cross section 1310 and cross section 1316 are aligned approximately along contour 1318.

Furthermore, embodiments described by FIGS. 12 and 13 may include conic-shaped defects instead of the shown hourglass (or reverse hourglass) defects. This may be accomplished, for example, by elongating freeform energy distribution 600, freeform energy distribution 700, or freeform energy distribution 800 so that only half of the hourglass (or reverse hourglass) shape of the freeform energy distribution is inside the workpiece, while the other half is outside. Therefore, in some embodiments, the size of the cross section of a defect increases continuously as the distance of cross section 1310 begins from the first surface and approaches the second surface, which describes a cone.

In some embodiment, the contours in FIGS. 12 and 13 are produced by laser processing, specifically by forming ordered defects. An application of these contours is the mass production of smaller articles from one larger article. For example, a substrate of glass having dimensions in the order of meters, or larger, is laser processed. The substrate is then cleaved into hundreds or thousands of smaller rectangles that may become, for example, screen digitizers for touch displays (e.g., in smartphones or tablets). Ideally, applying fabrication processes to the larger substrate would be the most efficient and convenient. In the example of screen digitizers, the time of volume production would be considerably shortened if the electronic components on the screens could be applied all at once on the larger substrate before dicing the substrate into the smaller individual devices. In some instances, laser processing the large substrate after completing electronics fabrication processes can cause incidental laser exposure of electronic components, excessive local heating, and compromising integrity of clean environment—all of which may damage critical electronic features, rendering individual devices inoperable.

A solution may be to laser-process the large substrate before applying other fabrication steps. The large substrate typically must be separated into the smaller articles soon after laser processing due to the reduced structural integrity at the contours. If fabrication processes are attempted on the substrate in this state, the reduced structural integrity of the contours may cause the substrate to separate inadvertently during the other fabrication steps. This make it very cumbersome to fabricate on the larger substrate, and thus fabrication is generally performed individually on the smaller, separated devices.

One reason for the reduced structural integrity at a contour is that the defects 'reach,' or intersect, the surfaces of the substrate (see defects 172 of FIG. 1). The formed defects may extend from top surface to bottom surface. Embodiments of the present disclosure provide products and methods that allow hidden defects that form delayed or latent break features. It is to be understood that the term "hidden," may not mean that the defects are not visible. In some embodiments, the term "hidden" may refer to placement of defects within a transparent workpiece so that the defects do not intersect, or have access to, the substrate's surfaces.

Referring to FIG. 12, in some embodiments, first defect 1208 and second defect 1214 do not intersect first surface 1204 and/or second surface 1206. Substrate 1200 further comprises product articles to be separated. The product articles are defined by a plurality of contours. The plurality of contours includes contour 1218. In some embodiments, the plurality of contours form latent separation features so as to allow the substrate to undergo a fabrication process as a single, larger article before being separated into the product articles. Embodiments represented in FIG. 13 may also include these features. By allowing formation of latent separation features, a substrate may undergo other fabrication steps (e.g., photolithography, etching, etc.) as a larger workpiece, allowing a much faster rate of volume processing of smaller articles broken off from the larger workpiece.

Figure 14:
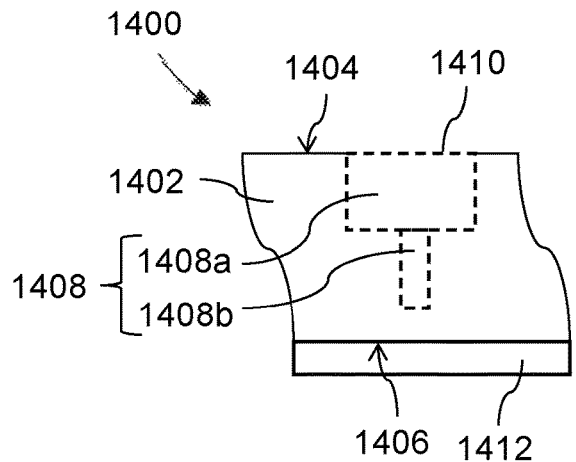

Substrates may also be fabricated for optical measurements of substances suspended in liquid solutions (e.g., well plates). FIG. 14 shows a section of a substrate 1400, according to one or more embodiments. Substrate 1400 comprises a body 1402, a first surface 1404, a second surface 1406, a defect 1408, and an opening 1410. Defect 1408 comprises an elliptic cylinder portion 1408a and a circular cylinder portion 1408b (e.g., formed by freeform energy distribution 500 of FIG. 5). In some embodiments, substrate 1400 comprises a coating 1412.

In some embodiments, defect 1408 elliptic cylinder portion 1408a is connected to circular cylinder portion 1408b. Elliptic cylinder portion 1408a is proximate to first surface 1404. Opening 1410 is disposed at an intersection between elliptic cylinder portion 1408a and first surface 1404. In the scenario where substrate 1400 is provided as a non-etched well plate (e.g., to be etched later), it is to be appreciated that opening 1410 is to be formed, in a subsequent etch, at an intersection between elliptic cylinder portion 1408*a* and first surface 1404.

In some embodiments, coating 1412 is an optical filter configured to filter radiation based on wavelength. The optical filter comprises a multivariate optical element (e.g., a multivariate optical filter or the like) configured to filter radiation based on a continuous spectrum. In some embodiments, coating 1412 is an antireflective coating. In some embodiments, coating 1412 is a protective layer configured to protect substrate 1400 from damage caused by impacts.

In some embodiments, defect 1408 comprises first and second cross sections that are parallel to first surface 1404. The first and second cross sections are defined by a boundary of the freeform shape of defect 1408. The first and second cross sections are geometrically dissimilar to each other.

Figure 15:
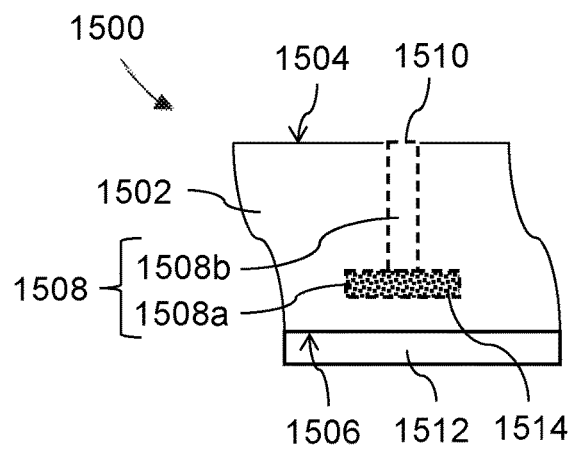

FIG. 15 shows a section of a substrate 1500, according to one or more embodiments. Substrate 1500 comprises a body 1502, a first surface 1504, a second surface 1506, a defect 1508, and an opening 1510. Defect 1508 comprises an elliptic cylinder portion 1508*a* and a circular cylinder portion 1508*b* (e.g., formed by freeform energy distribution 500 of FIG. 5, inverted). In some embodiments, substrate 1500 comprises a coating 1512. Defect 1508 comprises fractured particles 1514 of substrate 1500.

In some embodiments, elliptic cylinder portion 1508*a* is connected to circular cylinder portion 1508*b*. Circular cylinder portion 1508*b* is proximate to first surface 1504. Opening 1510 is disposed at an intersection between circular cylinder portion 1508*b* and first surface 1504. In the scenario where substrate 1500 is provided as a non-etched well plate (e.g., to be etched later), it is to be appreciated that opening 1510 is to be formed, in a subsequent etch, at an intersection between circular cylinder portion 1508*b* and first surface 1504.

The structure and functions of coating 1512 are the same as those described for coating 1412 (FIG. 14). In some embodiments, fractured particles 1514 are configured to enhance capillary action of liquid samples placed in defect 1508. Though not shown in some figures for clarity, fractured particles 1514 may be used in embodiments represented in other figures (e.g., FIGS. 14, 16, and 17).

In some embodiments, defect 1508 comprises first and second cross sections that are parallel to first surface 1504. The first and second cross sections are defined by a boundary of the freeform shape of defect 1508. The first and second cross sections are geometrically dissimilar to each other.

Figure 16:
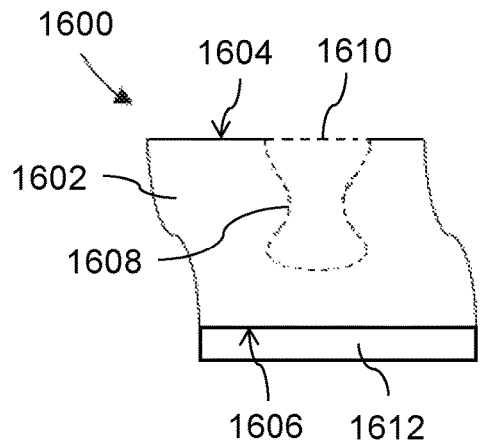

FIG. 16 shows a section of a substrate 1600, according to one or more embodiments. Substrate 1600 comprises a body 1602, a first surface 1604, a second surface 1606, a defect 1608, and an opening 1610. In some embodiments, substrate 1600 comprises a coating 1612. Defect 1608 comprises fractured particles 1614 of substrate 1600.

Defect 1608 comprises an hourglass shape (e.g., formed by freeform energy distribution 600 of FIG. 6, or 700 of FIG. 7). Opening 1610 is disposed at an intersection between defect 1608 and first surface 1604. In the scenario where substrate 1600 is provided as a non-etched well plate (e.g., to be etched later), it is to be appreciated that opening 1610 is to be formed, in a subsequent etch, at an intersection between defect 1608 and first surface 1604. The structure and functions of coating 1612 are the same as those described for coating 1412 (FIG. 14).

Figure 17:
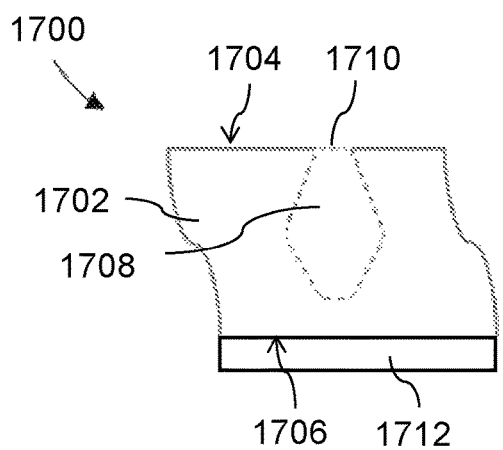

FIG. 17 shows a section of a substrate 1700, according to one or more embodiments. Substrate 1700 comprises a body 1702, a first surface 1704, a second surface 1706, a defect 1708, and an opening 1710. In some embodiments, substrate 1700 comprises a coating 1712. Defect 1708 comprises fractured particles 1714 of substrate 1700.

Defect 1708 comprises a reverse hourglass shape (e.g., formed by freeform energy distribution 800 of FIG. 8). Opening 1710 is disposed at an intersection between defect 1708 and first surface 1704. In the scenario where substrate 1700 is provided as a non-etched well plate (e.g., to be etched later), it is to be appreciated that opening 1710 is to be formed, in a subsequent etch, at an intersection between defect 1708 and first surface 1704. The structure and functions of coating 1712 are the same as those described for coating 1412 (FIG. 14).

In some embodiments, the laser systems and methods disclosed herein also allow fabrication of substrates for use in printed circuits applications. There is a need for circuits having dielectric properties that allow high frequency operation, e.g., microwave, far infrared, and higher frequencies. Resin and semiconductor-based substrates often experience dielectric breakdown when circuit components on the substrates operate at high frequencies. Fused silica, for example, may be a suitable substrate to solve this problem, since fused silica has a dielectric strength that is orders of magnitude greater than resin or semiconductors. Fused silica also does not absorb as much high frequency radiation as common electronic printed circuit boards. It may be difficult in fused silica and other glass-like substrates to fabricate through-vias that form satisfactory hermetic seals while providing electrical throughput from one surface of the board to the opposite surface. The laser systems and methods of the present disclosure allow fabrication of substrates that can be used as circuit boards in high frequency applications.

Figure 18:
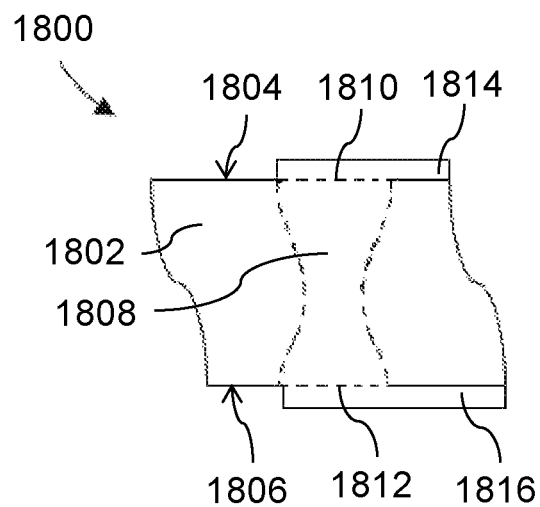

FIG. 18 shows a section of a substrate 1800, according to one or more embodiments. Substrate 1800 comprises a body 1802, a first surface 1804, a second surface 1806, a defect 1808, an opening 1810, and an opening 1812. In some embodiments, defect 1808 comprises electrically conductive material. Substrate 1800 further comprises an electrically conductive element 1814 and an electrically conductive element 1816 (e.g., electrical traces for transporting electrical signals).

In some embodiments, defect 1808 comprises an hourglass shape (e.g., formed by freeform energy distribution 600 of FIG. 6, or 700 of FIG. 7). The hourglass shape enhances hermetic sealing when defect 1808 is filled with electrically conductive, throughput material. Opening 1810 is disposed at an intersection between defect 1808 and first surface 1804. Opening 1812 is disposed at an intersection between defect 1808 and second surface 1806. In the scenario where substrate 1800 is provided as anon-etched substrate (e.g., to be etched later), opening 1810 and opening 1812 are to be formed, in a subsequent etch, at the previously indicated locations.

The electrically conductive material within defect 1808 is deposited using metal deposition techniques. Electrically conductive element 1814 is disposed on first surface 1804. Electrically conductive element 1816 is disposed on second surface 1806. Electrically conductive element 1814 and electrically conductive element 1816 are electrically coupled to each other through the conductive material of defect 1808.

Figure 19:
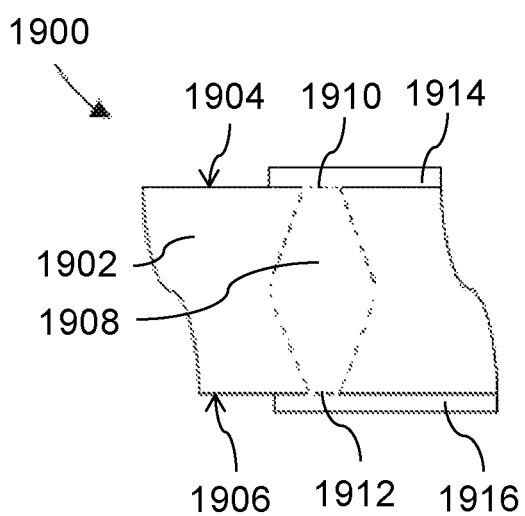

FIG. 19 shows a section of a substrate 1900, according to one or more embodiments. Substrate 1900 comprises a body 1902, a first surface 1904, a second surface 1906, a defect 1908, an opening 1910, and an opening 1912. In some embodiments, defect 1908 comprises electrically conductive material. Substrate 1900 further comprises an electrically conductive element 1914 and an electrically conductive element 1916.

In some embodiments, defect 1908 comprises a reverse hourglass shape (e.g., formed by freeform energy distribution 800 of FIG. 8). Opening 1910 is disposed at an intersection between defect 1908 and first surface 1904. Opening 1912 is disposed at an intersection between defect 1908 and second surface 1906. In the scenario where substrate 1900 is provided as a non-etched substrate (e.g., to be etched later), opening 1910 and opening 1912 are to be formed, in a subsequent etch, at the previously indicated locations.

The electrically conductive material within defect 1908 is deposited using metal deposition techniques. Electrically conductive element 1914 is disposed on first surface 1904. Electrically conductive element 1916 is disposed on second surface 1906. Electrically conductive element 1914 and electrically conductive element 1916 are electrically coupled to each other through the conductive material of defect 1908.

Figure 20:
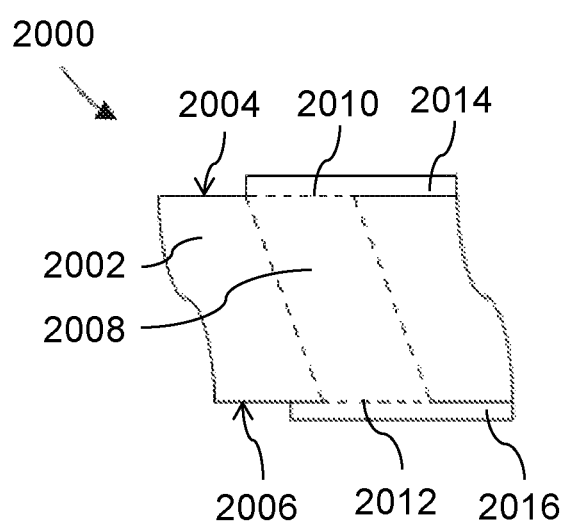

FIG. 20 shows a section of a substrate 2000, according to one or more embodiments. Substrate 2000 comprises a body 1902, a first surface 2004, a second surface 2006, a defect 2008, an opening 2010, and an opening 2012. In some embodiments, defect 2008 comprises electrically conductive material. Substrate 2000 further comprises an electrically conductive element 2014 and an electrically conductive element 2016.

In some embodiments, defect 2008 comprises an oblique circular, or elliptic, cylinder shape (e.g., canted cylinder). The angling of the cylinder shape is accomplished by adjusting a phase mask (e.g., phase mask 402 of FIG. 4) and/or a spatial light modulator (e.g., spatial light modulator 404 of FIG. 4) of the laser system used to form defect 2008. Opening 2010 is disposed at an intersection between defect 2008 and first surface 2004. Opening 2012 is disposed at an intersection between defect 2008 and second surface 2006. In the scenario where substrate 2000 is provided as a non-etched substrate (e.g., to be etched later), opening 2010 and opening 2012 are to be formed, in a subsequent etch, at the previously indicated locations.

The electrically conductive material within defect 2008 is deposited using metal deposition techniques. Electrically conductive element 2014 is disposed on first surface 2004. Electrically conductive element 2016 is disposed on second surface 2006. Electrically conductive element 2014 and electrically conductive element 2016 are electrically coupled to each other through the conductive material of defect 2008.

Embodiments described by FIGS. 18-20 may also be described in alternative fashions, For example, the substrate (e.g., substrate 1800) further comprises first and second sets of electrical conducting elements (e.g., electrical conducting element 1814 and electrical conducting element 1816). The first and second sets of electrical conducting elements are configured to allow signals to flow between the first and second surfaces (e.g., first surface 1804 and second surface 1806) and elements thereof.

Embodiments described by FIGS. 16-19 may include conic-shaped defects instead of the shown hourglass (or reverse hourglass) defects. This may be accomplished, for example, by elongating freeform energy distribution 600, freeform energy distribution 700, or freeform energy distribution 800 so that only half of the hourglass (or reverse hourglass) shape of the freeform energy distribution is inside the workpiece, while the other half is outside.

In view of the foregoing description, it should be understood that laser processing of workpieces and workpiece stacks may be enhanced by modifying the shape of the focal volume (e.g., freeform energy distribution) of a laser system. For example, the laser system may include a phase mask and/or adjustable blocking element to modify a shape of the freeform energy distribution of the laser. The modified freeform energy distribution is sent into a workpiece and a defect is formed in the workpiece. The formed defect has a shape substantially similar to the shape of the freeform energy distribution. Furthermore, the methods described herein allow fabrication of transparent substrates having defects with shapes that are not producible by known methods.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the specific value or end-point referred to is included. Whether or not a numerical value or end-point of a range in the specification recites "about," two embodiments are described: one modified by "about," and one not modified by "about." It will be further understood that the endpoints of each of the ranges are significant both in relation to the other endpoint, and independently of the other endpoint.

Directional terms as used herein—for example up, down, right, left, front, back, top, bottom—are made only with reference to the figures as drawn and are not intended to imply absolute orientation.

Unless otherwise expressly stated, it is in no way intended that any method set forth herein be construed as requiring that its steps be performed in a specific order, nor that with any apparatus specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation, and; the number or type of embodiments described in the specification.

As used herein, the singular forms "a," "an" and "the" include plural referents unless the context clearly dictates otherwise. Thus, for example, reference to "a" component includes aspects having two or more such components, unless the context clearly indicates otherwise.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A method comprising:
   forming a defect in or on an object, the forming comprising:
   directing a beam of radiation onto the object, the beam comprising:
   a quasi-non-diffracting beam;
   a focal volume having a freeform energy distribution;
   positioning the focal volume partially or fully within the object;
   generating the beam, the generating comprising:
   partially blocking the beam upstream of the focal volume to adjust an axial symmetry of the freeform energy distribution with respect to an optical axis of the beam using an adjustable blocking element; and/or
   spatially modulating a phase of the beam upstream of the focal volume to adjust a geometry of the freeform energy distribution using a phase mask,
   wherein the freeform energy distribution has energy sufficient to induce multi-photon absorption in a region of the object that is co-located with the focal volume and the induced multi-photon absorption produces the defect.

2. The method of claim 1, wherein the defect comprises a shape that is substantially similar to the freeform energy distribution.

3. The method of claim 1, wherein:
   the adjustable blocking element comprises a liquid crystal optical element; and
   the partially blocking comprises adjusting the liquid crystal optical element to selectively block a portion of the beam.

4. The method of claim 1, wherein the freeform energy distribution comprises a combination of a circular cylinder portion and elliptic cylinder portion, each having a longitudinal axis along an optical axis of the beam.

5. The method of claim 1, wherein the freeform energy distribution comprises an hourglass shape having a longitudinal axis along an optical axis of the beam.

6. The method of claim 1, wherein defect comprises a break feature, a cavity, or both.

7. The method of claim 1, wherein the object comprises a transparent substrate.

8. The method of claim 7, wherein the transparent substrate comprises crystalline quartz, fused silica, crown glass, borosilicate glass, soda lime glass, and/or phosphate glass, fluoride crystal, silicon crystal, sapphire, glass ceramics, transparent ceramics, polymers, or plastics.

9. The method of claim 7, wherein the transparent substrate comprises a semiconductor substrate.

10. The method of claim 9, wherein the semiconductor substrate comprises silicon, silicon carbide, germanium, gallium arsenide, indium gallium arsenide, aluminum gallium arsenide, gallium nitride, aluminum gallium nitride, indium phosphate, or lithium niobate.

11. The method of claim 7, wherein the transparent substrate comprises a composite wafer, wherein the composite wafer comprises a plurality of layers of different materials, and wherein the different materials comprise any of glass, ceramic, semiconductors, polymers, or plastic.

12. The method of claim 1, wherein the radiation comprises a wavelength in a range approximately from 250 nm to 2.0 μm.

13. The method of claim 1, wherein a rate of defect formation is greater than approximately 1000 defects per minute.

14. The method of claim 1, wherein the spatially modulating comprises moving an optical center of the phase mask away from the optical axis.

15. The method of claim 1, wherein the quasi-non-diffracting beam comprises:
   a wavelength $\lambda$;
   a spot size $w_o$; and
   a cross section that comprises a Rayleigh range $Z_R$ that is greater than $$F_D \frac{\pi w_0^2}{\lambda},$$

wherein $F_D$ is a dimensionless divergence factor having a value greater than approximately 10.

16. The method of claim 1, wherein:
   the freeform energy distribution comprises a first cross section and a second cross section; and
   the second cross section is parallel to the first cross section and is geometrically dissimilar from the first cross section.

* * * * *